US008424885B2

(12) United States Patent
Woodbury, II et al.

(10) Patent No.: US 8,424,885 B2
(45) Date of Patent: Apr. 23, 2013

(54) METHOD AND APPARATUS FOR AN ENVIRONMENTALLY-PROTECTED ELECTRONIC EQUIPMENT ENCLOSURE

(75) Inventors: William E. Woodbury, II, Gilbert, AZ (US); Simon R. Rohrich, Chandler, AZ (US)

(73) Assignee: Elliptical Mobile Solutions, LLC, Chandler, AZ (US)

( * ) Notice: Subject to any disclaimer, the term of this patent is extended or adjusted under 35 U.S.C. 154(b) by 305 days.

(21) Appl. No.: 12/620,510

(22) Filed: Nov. 17, 2009

(65) Prior Publication Data

US 2010/0110634 A1 May 6, 2010

Related U.S. Application Data

(63) Continuation-in-part of application No. 11/608,386, filed on Dec. 8, 2006, now Pat. No. 7,628,409, which is a continuation-in-part of application No. 11/317, 414, filed on Dec. 22, 2005, now Pat. No. 7,461,849.

(51) Int. Cl.
 *B62B 1/00* (2006.01)
(52) U.S. Cl.
 USPC ............ 280/47.35; 280/47.34; 280/79.3
(58) Field of Classification Search ............ 280/47.35, 280/47.34, 793.3, 40, 645, 47, 79.3; 174/50, 174/17 R, 54, 59, 16.1; 361/695, 692, 693, 361/624, 690, 679.47, 687; 312/198, 111, 312/265.3, 265.4, 351.1, 236
See application file for complete search history.

(56) References Cited

U.S. PATENT DOCUMENTS

| | | | |
|---|---|---|---|
| 3,038,739 A | 6/1962 | Vogel | |
| 3,181,878 A | 5/1965 | Vogel | |
| 3,192,306 A * | 6/1965 | Skonnord | 174/16.1 |
| 3,275,277 A | 9/1966 | Illar et al. | |
| 3,558,154 A | 1/1971 | Jackson | |
| 3,563,627 A * | 2/1971 | Whipps | 312/265.2 |
| 3,701,499 A | 10/1972 | Schubert et al. | |
| 3,725,746 A * | 4/1973 | Carroll | 361/624 |
| 3,797,691 A * | 3/1974 | Williams, Jr. | 220/1.5 |
| 4,351,515 A | 9/1982 | Yoshida | |
| 4,763,923 A | 8/1988 | Raidel | |
| 5,021,763 A | 6/1991 | Obear | |
| 5,396,973 A | 3/1995 | Schwemmer et al. | |
| 5,431,261 A | 7/1995 | Olgac | |

(Continued)

FOREIGN PATENT DOCUMENTS
EP 0393655 10/1990

OTHER PUBLICATIONS

USPTO, Notice of Allowance, U.S. Appl. No. 11/317,414, Sep. 25, 2008, 7 pages.

(Continued)

*Primary Examiner* — Hau Phan

(57) ABSTRACT

A method and apparatus for an electronic equipment enclosure that provides directed airflow only to those volumes within the enclosure that require the airflow. The electronic equipment enclosure further provides protection from contaminants such as falling dirt, rain, sleet, snow, windblown dust, splashing water, hose-directed water, and ice. A pedestal may be coupled to the electronic equipment enclosure that facilitates movement of the electronic equipment enclosure via a pallet jack, forklift, front loader, or similar jacking device. A sidecar may also be coupled to one or more sides of the electronic equipment enclosure to facilitate vertically mounted equipment within the sidecar.

11 Claims, 15 Drawing Sheets

U.S. PATENT DOCUMENTS

| | | | |
|---|---|---|---|
| 5,433,422 | A | 7/1995 | Ross |
| 5,794,909 | A | 8/1998 | Platus |
| 5,822,707 | A | 10/1998 | Breed et al. |
| 5,823,307 | A | 10/1998 | Schubert et al. |
| 5,851,143 | A * | 12/1998 | Hamid .......................... 312/236 |
| 5,918,551 | A * | 7/1999 | Liu .............................. 108/55.1 |
| 5,975,508 | A | 11/1999 | Beard |
| 6,082,715 | A | 7/2000 | Vandermolen |
| 6,086,060 | A | 7/2000 | Berthold |
| 6,129,434 | A * | 10/2000 | Melane et al. ............. 312/351.1 |
| 6,170,622 | B1 | 1/2001 | Wakui et al. |
| 6,179,398 | B1 * | 1/2001 | Martin ....................... 312/265.4 |
| 6,238,029 | B1 * | 5/2001 | Marzec et al. ............. 312/265.3 |
| 6,412,759 | B1 | 7/2002 | Krauss |
| 6,412,789 | B1 | 7/2002 | Pierce |
| 6,443,542 | B1 * | 9/2002 | Lindquist et al. ............. 312/198 |
| 6,719,258 | B2 | 4/2004 | Bryngelson et al. |
| 6,752,250 | B2 | 6/2004 | Tanner |
| 6,907,969 | B2 | 6/2005 | Ichikawa et al. |
| 6,918,600 | B2 | 7/2005 | Dodd et al. |
| 7,144,320 | B2 * | 12/2006 | Turek et al. ................... 361/695 |
| 7,180,738 | B2 * | 2/2007 | Mandel et al. ................ 361/695 |
| 7,880,084 | B2 * | 2/2011 | Adducci et al. ................ 174/50 |
| 7,903,402 | B2 * | 3/2011 | Tomioka et al. ......... 361/679.47 |
| 7,957,139 | B2 * | 6/2011 | Davis et al. ................... 361/690 |
| 2003/0057618 | A1 | 3/2003 | Tanner |
| 2004/0130442 | A1 | 7/2004 | Breed et al. |
| 2006/0226289 | A1 | 10/2006 | Robbins et al. |
| 2006/0237885 | A1 | 10/2006 | Paillard |
| 2006/0267297 | A1 | 11/2006 | Nordmeyer |
| 2007/0278057 | A1 | 12/2007 | Werely et al. |
| 2007/0278723 | A1 | 12/2007 | Shoemaker et al. |
| 2008/0007911 | A1 * | 1/2008 | Hallin et al. .................. 361/687 |
| 2008/0015753 | A1 | 1/2008 | Werely et al. |
| 2008/0068791 | A1 * | 3/2008 | Ebermann ..................... 361/687 |
| 2008/0156602 | A1 | 7/2008 | Hiemenz et al. |
| 2009/0061755 | A1 * | 3/2009 | Calder et al. .................. 361/692 |

OTHER PUBLICATIONS

USPTO, Office Action, U.S. Appl. No. 11/317,414, Apr. 21, 2008, 6 pages.
USPTO, Notice of Allowance, U.S. Appl. No. 11/321,970, Jul. 10, 2009, 6 pages.
USPTO, Office Action, U.S. Appl. No. 11/321,970, Feb. 25, 2009, 4 pages.
USPTO, Office Action, U.S. Appl. No. 11/321,970, Oct. 2, 2008, 5 pages.
USPTO, Office Action, U.S. Appl. No. 11/321,944, Aug. 3, 2009, 9 pages.
USPTO, Office Action, U.S. Appl. No. 11/321,944, Jan. 12, 2009, 9 pages.
USPTO, Office Action, U.S. Appl. No. 11/321,944, Jun. 17, 2008, 8 pages.
USPTO, Notice of Allowance, U.S. Appl. No. 11/608,386, Jul. 10, 2009, 7 pages.
USPTO, Office Action, U.S. Appl. No. 11/608,386, Feb. 24, 2009, 4 pages.
USPTO, Notice of Allowance, U.S. Appl. No. 11/608,561, Mar. 12, 2009, 7 pages.
USPTO, Office Action, U.S. Appl. No. 11/608,561, Oct. 17, 2008, 6 pages.
USPTO, Notice of Allowance, U.S. Appl. No. 11/608,708, Feb. 16, 2010, 6 pages.
USPTO, Office Action, U.S. Appl. No. 11/608,708, Sep. 10, 2009, 9 pages.
USPTO, Office Action, U.S. Appl. No. 11/278,642, Jan. 4, 2012, 12 pages.
USPTO, Office Action, U.S. Appl. No. 11/278,642, Mar. 11, 2011, 11 pages.
USPTO, Office Action, U.S. Appl. No. 11/278,642, Aug. 3, 2010, 11 pages.
USPTO, Office Action, U.S. Appl. No. 11/278,642, Mar. 2, 2010, 11 pages.
USPTO, Office Action, U.S. Appl. No. 11/278,642, Jul. 28, 2009, 10 pages.
USPTO, Office Action, U.S. Appl. No. 11/609,833, Jul. 19, 2012, 8 pages.
USPTO, Office Action, U.S. Appl. No. 11/609,833, Jun. 8, 2011, 6 pages.
USPTO, Office Action, U.S. Appl. No. 11/609,833, Nov. 26, 2010, 6 pages.
USPTO, Office Action, U.S. Appl. No. 11/609,833, Feb. 2, 2010, 6 pages.
USPTO, Office Action, U.S. Appl. No. 12/564,875, Aug. 8, 2012, 6 pages.
USPTO, Office Action, U.S. Appl. No. 12/564,875, Nov. 10, 2011, 5 pages.
USPTO, Office Action, U.S. Appl. No. 11/620,510, Aug. 2, 2012, 9 pages.
USPTO, Office Action, U.S. Appl. No. 11/620,510, Jan. 11, 2012, 9 pages.
PCT, ISR, PCT/US06/62065, Apr. 24, 2008, 2 pages.
PCT, WO, PCT/US06/62065, Apr. 24, 2008, 6 pages.
PCT, ISR, PCT/US06/62069, Nov. 10, 2008, 2 pages.
PCT, WO, PCT/US06/62069, Nov. 10, 2008, 3 pages.
PCT, ISR, PCT/US06/62119, Aug. 20, 2008, 2 pages.
PCT, WO, PCT/US06/62119, Aug. 20, 2008, 5 pages.
PCT, ISR, PCT/US06/62123, Aug. 26, 2008, 2 pages.
PCT, WO, PCT/US06/62123, Aug. 26, 2008, 3 pages.
Canadian IPO, Office Action, 2,633,893, May 18, 2010, 3 pages.
Canadian IPO, Office Action, 2,633,892, Mar. 5, 2010, 2 pages.
Canadian IPO, Office Action, 2,633,946, Jan. 31, 2011, 2 pages.
Canadian IPO, Office Action, 2,633,891, May 18, 2010, 2 pages.
Canadian IPO, Office Action, 2,633,891, Mar. 28, 2011, 2 pages.
Chinese IPO, Office Action, 200680051278.5, Feb. 9, 2011, 3 pages.
Chinese IPO, Office Action, 200680048216.9, Aug. 21, 2009, 4 pages.
Chinese IPO, Office Action, 200680049762.4, Jul. 1, 2010, 5 pages.
Chinese IPO, Office Action, 200680051278.5, Mar. 1, 2010, 4 pages.
Chinese IPO, Office Action, 200680049692.2, May 9, 2011, 8 pages.
Chinese IPO, Office Action, 200680049692.2, Mar. 19, 2010, 7 pages.
Chinese IPO, Office Action, 200680049762.4, Jun. 14, 2012, 3 pages.
Chinese IPO, Office Action, 200680049762.4, Dec. 22, 2011, 10 pages.
Korean IPO, Office Action, 10-2008-7017873, Jun. 30, 2010, 3 pages.
Korean IPO, Office Action, 10-2008-7017873, Dec. 28, 2010, 3 pages.
Korean IPO, Office Action, 10-2008-7017873, Sep. 30, 2011, 3 pages.
Korean IPO, Office Action, 10-2008-7017873, Jul. 28, 2010, 5 pages.
Korean IPO, Final Office Action, 10-2008-7017874, Jan. 24, 2011, 3 pages.
USPTO, Office Action, U.S. Appl. No. 11/278,642, Sep. 18, 2012, 11 pages.
USPTO, Office Action, U.S. Appl. No. 11/609,833, Oct. 17, 2012, 9 pages.
Chinese Patent Office, Office Action, 200680049762.4, Sep. 26, 2012, 3 pages.
Extended European Search Report, 06848446.8, May 25, 2011, 8 pages.
Extended European Search Report, 06846613.5, Jun. 6, 2011, 7 pages.
European Patent Office, 06848446.8, Oct. 19, 2012, 4 pages.
European Patent Office, Interview Summary, 06846613.5, Oct. 30, 2012, 3 pages.

* cited by examiner

METHOD AND APPARATUS FOR AN ENVIRONMENTALLY-PROTECTED ELECTRONIC EQUIPMENT ENCLOSURE

This application is a continuation-in-part of application Ser. No. 11/608,386, filed Dec. 8, 2006, which is a continuation-in-part of application Ser. No. 11/317,414, filed Dec. 22, 2005, the contents of which are incorporated herein by reference in their entirety.

FIELD OF THE INVENTION

The present invention generally relates to electronic equipment enclosures, and more particularly to environmentally-protected electronic equipment enclosures that incorporate high-efficiency cooling techniques.

BACKGROUND

The proliferation of technology in today's society has created such a dependence that life without it would likely cease to exist as it is known today. For example, the convenience of communication devices such as wireless telephones, wireless pagers, and personal digital assistants (PDAs) have facilitated visual, audible, and tactile communications to be conducted virtually anytime and anywhere.

Portable computing devices, such as laptop computers, have also contributed to technology proliferation, since they allow productive activity in a hotel room, on an airplane, or simply in the comfort of one's own home. Individuals, however, are not the only members of society that are taking advantage of today's technology. Business units in virtually all fields of commerce have come to depend upon the advancement of technology to provide the edge that is required to keep them competitive.

A particular business entities' operations, for example, may require primarily static operational facilities, or conversely may require primarily dynamic operational facilities. Regardless of the nature of the business entities' operations, they will most likely depend upon advancements in technology to maintain their competitive edge. The operations of disaster relief organizations, for example, may be characterized as primarily dynamic, since the locale of a disaster relief organizations' operations may be the epicenter of a recent earthquake, or a flood zone left in the wake of a recent hurricane. Other primarily dynamic business operations may be exemplified by those of a local crime scene investigation (CSI) laboratory, whose primary activities include the collection and analysis of forensic evidence at a remote crime scene. Other primarily dynamic business operations may include those of news and movie industries, whereby collection of digital data is the primary objective during their respective operations.

Conversely, the characterization of a particular business entities' operation may be one that is primarily static. For example, telecommunication facilities are often provided all over the world to facilitate wireless and/or terrestrial based communications. Such installations often include switch equipment rooms that include a large number of electronic equipment racks that have been installed to provide both circuit switched, and packet switched, data exchange. Other forms of primarily static installations may include data migration centers, which offer large amounts of storage capability for a variety of applications that require data integrity.

It can be seen, therefore, that business operations conforming to either of the primarily static, or primarily dynamic, paradigm have occasion to provide electronic facilities that require at least some aspects of mobility. Primarily dynamic entities, for example, are often faced with the daunting task of mobilizing data computation and data storage facilities into an area that is not particularly conducive to such operations. A military unit, for example, may require temporary data storage and computational facilities at a site that is primarily characterized by extreme conditions, such as a desert or tropical environment. As such, the data computation/storage facilities required by the military unit are required to be mobile and operational in an environment that is particularly prone to at least one of high temperature, high humidity, and/or dust contamination. Furthermore, such an environment may not be particularly secure, nor topographically conducive, to the transportability of highly sensitive electronics.

Primarily static entities are also in need of mobile electronic facilities, since such facilities may be vulnerable to equipment failure, or simply may be in need of equipment upgrade. As such, a mobile electronic solution is needed to provide electronic equipment replacement, or augmentation, to fully support the replacement of failed electronics, or to augment the current capabilities of the electronic facility.

Traditional electronic enclosure solutions, however, simply fail in many respects to meet the demands of today's electronic enclosure requirements. Cooling techniques implemented within traditional electronic enclosures, for example, simply do not offer the efficiencies required to cool today's high-density electronic applications. Furthermore, environmental protection for today's electronic equipment enclosures is virtually non-existent, since such enclosures are typically implemented within buildings that offer protection from the environment. Efforts continue, therefore, to provide cooling solutions that exhibit higher cooling efficiencies, especially for outdoor electronic equipment enclosure applications.

SUMMARY

To overcome limitations in the prior art, and to overcome other limitations that will become apparent upon reading and understanding the present specification, various embodiments of the present invention disclose an apparatus and method of providing environmentally-protected electronic equipment enclosures. Certain of the environmentally-protected characteristics may include protection from environmental contaminants, such as falling dirt, rain, sleet, snow, windblown dust, splashing water, hose-directed water, and ice. Improved cooling through zero-bypass ducting is also provided within the environmentally-protected electronic equipment enclosures.

In accordance with one embodiment of the invention, an electronic component enclosure comprises a pedestal that is adapted to accept forks of a jacking device, an inner frame that is coupled to the pedestal, where the inner frame is adapted to accept a first set of electronic components. Movement of the inner frame is facilitated by movement of the pedestal by the jacking device.

In accordance with another embodiment of the invention, an electronic component enclosure comprises a platform, an inner frame that is coupled to the platform, an enclosure surrounding the inner frame, a first set of electronic components mounted within the inner frame and an environment control unit coupled to the enclosure, where the environment control unit is adapted to generate airflow. The electronic component enclosure further comprises a plenum formed below the inner frame, where the plenum forms a duct to direct the airflow to the first set of electronic components. The electronic component enclosure further comprises a ducted channel that is coupled to the environment control unit and the plenum to direct the airflow from the environment control unit to the plenum.

In accordance with another embodiment of the invention, an electronic component enclosure comprises a platform, an inner frame that is coupled to the platform, a first set of electronic components mounted within the inner frame, and a water-resistant enclosure coupled to the inner frame. The water-resistant enclosure is adapted to shield the first set of electronic components from contaminants.

In accordance with another embodiment of the invention, an electronic equipment enclosure comprises an inner frame, electronic components mounted within the inner frame, an enclosure surrounding the inner frame, and a plenum that is formed below the inner frame, the plenum being adapted to direct airflow to the electronic components. The electronic components receive the airflow from a first region within the enclosure and exhaust the airflow into a second region within the enclosure, the first region having a higher pressure relative to the second region.

BRIEF DESCRIPTION OF THE DRAWINGS

Various aspects and advantages of the invention will become apparent upon review of the following detailed description and upon reference to the drawings in which.

DETAILED DESCRIPTION

Figure 1A:
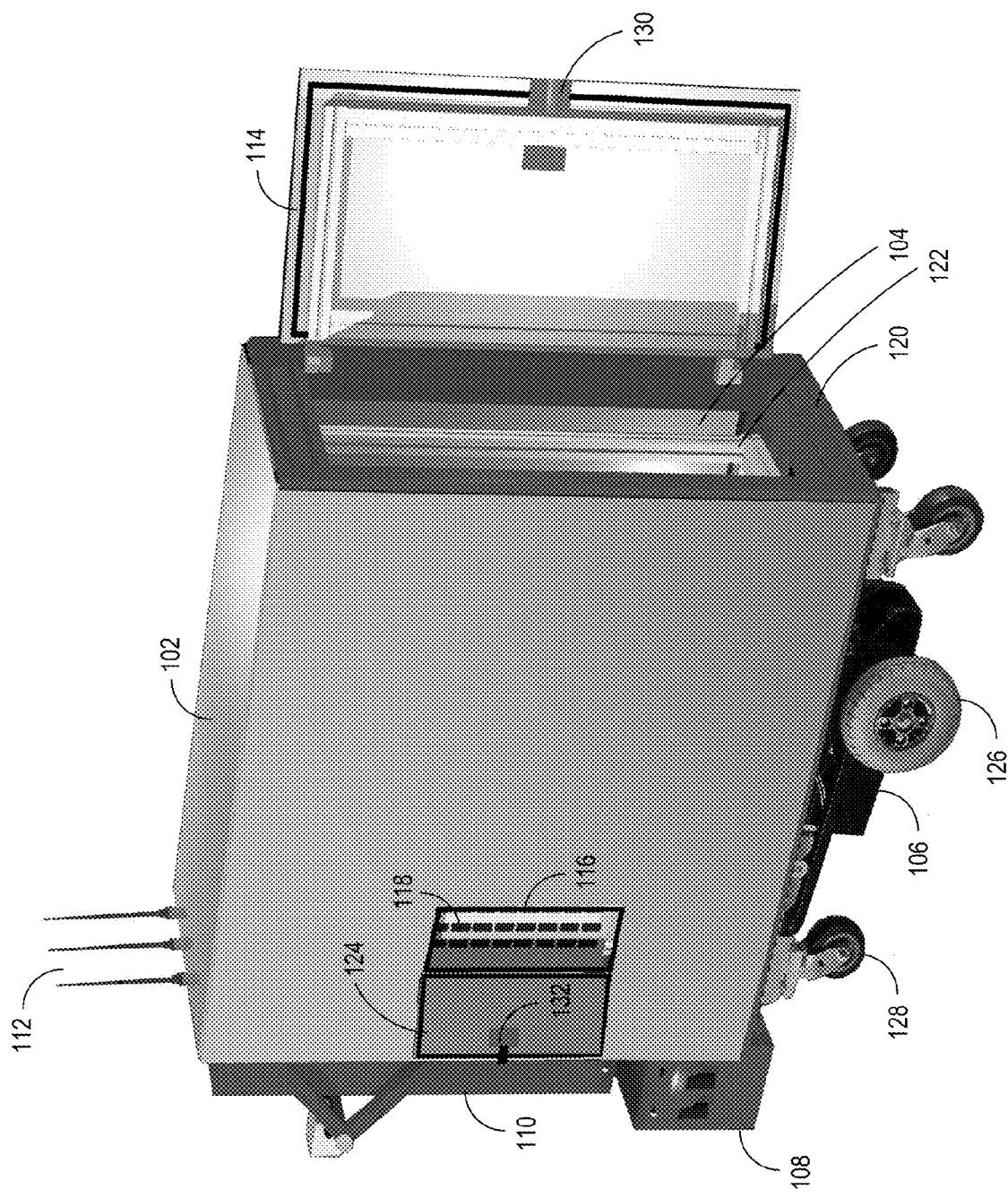
FIG. 1A illustrates an exemplary mobile electronic equipment rack.

Generally, the various embodiments of the present invention are applied to an electronic equipment rack that, inter alia, may provide mobility through directional self-propulsion and multi-axis suspension. The electronic equipment rack may further provide self-powered operation and environmental control with wireless access, while protecting against unauthorized access, electromagnetic interference, and dust contamination.

In one embodiment, for example, the mobile electronic equipment rack may utilize a two-sided platform, whereby support is provided for electronic components mounted on one side of the platform and directional propulsion is provided on the other side of the platform. Directional control may be provided via a wired, electronic tether, or conversely may be provided via wireless control.

Accordingly, the mobile electronic equipment rack may first be fully populated with electronic components and then utilized as a remotely piloted transport mechanism to transport the mobile electronic equipment rack to any position/location that may be necessary for a given application. A multi-axis suspension system may be further employed within the mobile electronic equipment rack to substantially eliminate the transfer of kinetic energy to the electronic components that are contained within the mobile electronic equipment rack during positioning/re-location.

In an alternate embodiment, a non-mobile electronic equipment rack may be provided without directional self-propulsion. In this instance, a multi-axis suspension system is nevertheless employed so that kinetic energy resulting from for example, seismic events may be substantially absorbed. Non-mobile electronic equipment racks in non-stable environments, such as on water based vessels or off-shore oil derricks, may also be equipped with a multi-axis suspension system so as to substantially absorb wave induced kinetic energy.

Other, non-mobile electronic equipment rack applications may include airborne applications, whereby kinetic energy transfer due to atmospheric turbulence may also be substantially eliminated. Still other non-mobile electronic equipment rack applications may include motor vehicle based applications, whereby kinetic energy transfer due to non-ideal road conditions may also be substantially eliminated.

In still other embodiments, mobile or non-mobile electronic equipment enclosures may not utilize a multi-axis suspension system at all. Rather, such electronic equipment enclosures are intended for use in areas that are not subject to movement. Alternately, such electronic equipment enclosures may be subject to movement that is somewhat benign, resulting in minimal kinetic energy transfer to the electronic components contained within the electronic equipment enclosures.

In either of the mobile, or non-mobile, electronic equipment rack embodiments, a multi-mode, dampened suspension system may be utilized. In the first mode of suspension, coarse suspension control is provided to effect a weight bearing support, whereby the magnitude of support provided adapts to the combined weight of the electronic components and their respective mounting enclosure. For example, as electronic components are added, the coarse suspension control adapts by increasing the amount of opposing force that is necessary to maintain the position of the electronic components within a coarse position range. Conversely, as electronic components are removed, the coarse suspension control adapts by decreasing the amount of opposing force that is necessary to maintain the position of the electronic components within the coarse position range.

In a second mode of suspension, fine suspension control may be provided through a damper mechanism, which opposes movement and seeks to maintain a position of the payload within a fine position range. In a first embodiment, a static, magnetorheologically (MR) controlled damper force may be applied to effect static dampening. In particular, a statically controlled MR damper signal is provided to the damper mechanism to provide a fixed amount of damper force to maintain the mounting enclosure within a fine position range.

In an alternate embodiment, the damper force may be adaptive, such that the magnitude of the damper force is set in response to an adaptive, MR feedback control signal from, for example, a micro-electro mechanical system (MEMS) accelerometer measurement device. As such, the damper force may be adaptively increased in response to accelerometer feedback indicating increased acceleration. Conversely, the damper force may be adaptively decreased in response to accelerometer feedback indicating decreased acceleration.

A third mode of suspension may utilize a combination of an air piston and an air reservoir to implement a pneumatic spring. In such an instance, the use of coiled energy springs, or any other mechanical spring mechanism, is obviated, since the interaction of the air piston with the elasticity of the air reservoir combines to generate a spring-like action. A fourth mode of suspension may utilize elastomeric mounts having variable resonant frequencies, such that vibration/shock absorbing properties of the variable frequency elastomeric mounts may be staggered in frequency to expand the operational bandwidth of the suspension system.

Once the electronic equipment rack arrives at its designated position/location, or conversely is operated in a non-mobile application as discussed above, power may be applied to the electronic equipment rack via an external power bus, so that each electronic component within the electronic equipment rack may be made to be fully operational. Operational power is typically applied in an alternating current (AC) mode, which in one embodiment, may necessitate conversion to a direct current (DC) mode prior to application to the electronic components.

In other embodiments, however, AC power may be directly applied to the electronic components once the AC power has been appropriately conditioned. Power conditioning, for example, may be applied to the incoming AC power signal, to filter electro-magnetic interference (EMI), or any other form of noise, from the incoming AC power signal. The power conditioner may also utilize an isolation transformer to isolate the electronic components from power surges existing within an AC power signal received, for example, from a common power grid. Once conditioned, the AC power may then be applied to an internal power bus within the electronic equipment rack for consumption by the electronic components.

In such instances, for example, operation of the electronic components within the electronic equipment rack may be compatible (e.g., through operation of the power conditioner) with AC power grids operating at a plurality of amplitudes, e.g., 110 VAC or 220 VAC, and a plurality of frequencies, e.g., 50 Hz or 60 Hz. In an alternate embodiment, the power conditioner may also be utilized in aviation applications, where the power grid may be operating at a DC potential of 28 VDC, or conversely, 115/230 VAC at 400 Hz or 480 Hz.

Additionally, any noise that may be propagated from the electronic components to the internal power bus may also be filtered by the power conditioner, so that other equipment operating from the common power grid may be substantially free of noise contamination that may be generated by the electronic components. Furthermore, the electronic equipment rack may be fully encapsulated within an environment proof enclosure that may act as an EMI protective shield so as to limit the amount of EMI propagating into, or from, the electronic equipment rack.

The environment proof enclosure may also serve to maintain the electronic equipment rack within a substantially constant operational temperature range. In such an instance, the temperature within the environment proof enclosure is held substantially constant irrespective of the temperature variation outside of the environment proof enclosure and irrespective of the amount of heat generated by the electronic components operating within the electronic equipment rack.

In one embodiment, a heating, ventilation, and air conditioning (HVAC) unit may be mounted on any side of the environment proof enclosure. An internal channel, or ducting system, may be utilized to direct heat exchanged, i.e., cooled, airflow from the HVAC unit toward the opposite end of the electronic equipment rack. The cooled air is then allowed to flow upward, so that the electronic components operating within the electronic equipment rack may draw the cooled air into their respective interiors for cooling.

Once the air conditioned air is drawn into the individual electronic component interiors, heat is exchanged from the individual electronic components to the cooled airflow to effectively maintain the electronic components operational within their respective temperature limits. The heated air may then be vented from the individual electronic components and collected at the other end of the electronic equipment rack for cooling by the HVAC unit.

In addition to maintaining air temperature within the environment proof enclosure, humidity may also be controlled by the HVAC unit through appropriate humidification control via, e.g., mechanical refrigeration or desiccant-based dehumidification. Thus, the HVAC implemented humidity control may correct for excessively high humidity, so that corrosion of electrical contacts within the environment proof enclosure is virtually eliminated. Conversely, the HVAC implemented humidity control may also correct for excessively low humidity, so that electrostatic discharge effects (ESD) may be mitigated.

Alternative active thermal management techniques may also be utilized within the environment proof enclosure, which may include liquid-based cooling systems, where liquids such as water, refrigerant, glycol, etc., may be used to remove heat that is generated within the environment proof enclosure. Sensor input data generated from thermal, airflow, power, and fluid flow sensors within the environment proof enclosure may be further utilized to maximize heat removal efficiency through dynamic control of a combination of variable speed fans, variable flow rate fluid pumps, and digitally controlled compressors.

Since the environmental control system is a closed loop system, dust control is inherently implemented within the environment proof enclosure. That is to say, for example, that heat is exchanged without introduction of external air into the environment proof enclosure. As such, not only is dust prevented from entering the environment proof enclosure, but any dust that may be trapped within the environment proof enclosure prior to sealing, is immediately captured by an internal dust filter during circulation of the heat exchanged airflow from the HVAC unit.

Data egress from the environment proof enclosure and data ingress to the environment proof enclosure may be accomplished, for example, via a multiple-in, multiple-out (MIMO) wireless interface. In particular, multiple antennas may be used to provide a diverse, wireless access point (WAP), whereby multipath signals may each be received and coherently combined for added signal strength. As such, the range of access and data rate may be considerably increased as compared, for example, to the IEEE 802.11a, 802.11b, and 802.11g family of wireless communication specifications.

Data egress and ingress to the environment proof enclosure may also be accomplished via a keyboard, video, mouse (KVM) wireless switch. The KVM wireless switch may be used, for example, to allow access to network management and control features that may be provided by the electronic components hosted within the environment proof enclosure. It should be noted, that both the MIMO and KVM interfaces allow access to the electronic components, while the electronic components are operational within the environment proof enclosure. An alternate, wired interface may also be used in addition to, or instead of, the KVM and/or MIMO wireless interfaces for essentially the same purposes.

Security and safety features may also be incorporated within the electronic equipment rack, so that unauthorized access to the data storage, computational resources, or any other application of the electronic components, may be prohibited. Other security features may employ a multi-user/multi-function access control to allow permission for specific users to perform specific functions. For example, specific users may be individually authorized to mobilize and/or energize the mobile electronic equipment rack. Specific users may also be individually authorized to access the mobile electronic equipment rack via electronically controlled access hatches should it be encapsulated within an environment proof enclosure.

Turning to FIG. 1A, an exemplary embodiment of a mobile electronic equipment rack is illustrated. Directional self-propulsion may be facilitated by mobility control device 106, which may be mounted to a bottom surface of platform 120. Mobility control device 106 may be electro-mechanically controlled via, for example, a DC drive motor (not shown), to convert mobility control signals into directional propulsion to maneuver the mobile electronic equipment rack into its designated position/location.

Mobility control signals may be provided to mobility control device 106 through a wireless, or wired, medium. Wired access, for example, may be supplied via a tether control mechanism (not shown) that may be attached via patch panel 116, or some other interface. One of input/output (I/O) interface connectors 118, for example, may facilitate exchange of mobility control signals to/from mobility control device 106.

A wide variety of mobility control information may be accepted by mobility control device 106 to control such mobility aspects as velocity, direction, and acceleration/deceleration. A center wheel drive, for example, may be utilized to receive directional control signals to provide 360 degree maneuverability of the mobile electronic equipment lack via drive wheels 126. In particular, drive wheel 126 and the opposing drive wheel (not shown) are independently activated via an articulated transaxle drive, which facilitates a 0 degree turn radius. Casters 128 are also provided for stability, both during transport, as well as during stationary operation. As discussed in more detail below, user's wishing to maneuver the mobile electronic equipment rack via mobility control device 106 may first be required to authenticate themselves through security control features implemented within the mobile electronic equipment rack.

Figure 1B:
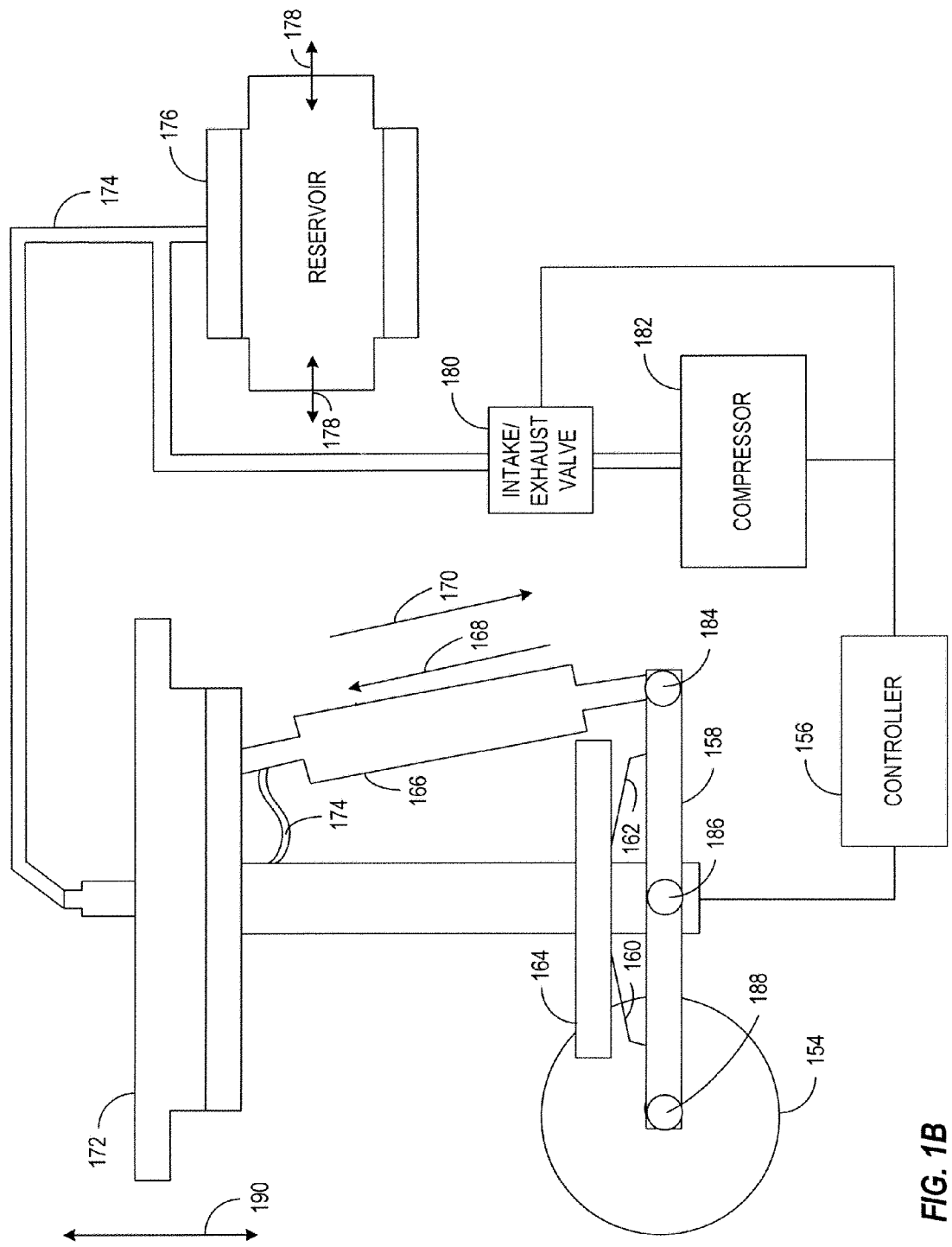
FIG. 1B illustrates an exemplary block diagram of a pneumatically sprung swivel caster mechanism that may be used in the mobile electronic equipment rack of FIG. 1A.

Turning to FIG. 1B, an alternate embodiment is illustrated, whereby casters 128 may provide an additional mode of suspension, while simultaneously providing an adjustable ride height of the mobile electronic equipment rack. In particular, the pneumatically sprung swivel caster mechanism of FIG. 1B may provide an independently controlled ride height for each corner of the mobile electronic equipment rack depending upon the terrain.

For example, should the mobile electronic equipment rack be required to traverse an incline, the fore mounted pneumatically sprung swivel casters may be commanded to a ride height that is higher than a ride height of the aft mounted pneumatically sprung swivel casters, so as to provide increased ground clearance at the leading edge of the mobile electronic equipment rack as compared to the trailing edge. Such ride height control may be adapted, for example, to prevent striking the inclined surface with the bottom portion of the mobile electronic equipment rack during traversal of the incline.

Caster 154 is mounted to pivoting axle 158 and is allowed to rotate about axis 188 to facilitate mobility of the mobile electronic equipment rack. Air piston 166 is mounted to pivoting axle 158 via mount 184, which is located at the opposite end of pivoting axle 158 with respect to caster 154. Air piston 166 may be programmably adapted by controller 156 to either contract its length along axis 168, or expand its length along axis 170 so as to cause pivoting axle 158 to pivot about axis 186.

If air piston 166 is programmed to contract its length along axis 168, for example, then pivoting axle 158 is caused to rotate in a counter-clockwise direction about axis 186, which causes mount 184 to move upward along axis 168. In response, caster 154 is caused to move downward along axis 170, which ultimately causes swivel plate 172 to increase its position along axis 190 with respect to caster 154. Thus, given that swivel plate 172 is mounted to one corner of the bottom surface of platform 120 of the mobile electronic equipment rack of FIG. 1A, then that corner is caused to elevate its position with respect to the surface that caster 154 is rotating upon.

If, on the other hand, air piston 166 is programmed to expand its length along axis 170, then pivoting axle 158 is caused to rotate in a clockwise direction about axis 186, which causes mount 184 to move downward along axis 170. In response, caster 154 is caused to move upward along axis 168, which ultimately causes swivel plate 172 to decrease its position along axis 190 with respect to caster 154. Thus, given that swivel plate 172 is mounted to one corner of the bottom surface of platform 120 of the mobile electronic equipment rack of FIG. 1A, then that corner is caused to lower its position with respect to the surface that caster 154 is rotating upon.

It can be seen, therefore, that each corner of the mobile electronic equipment rack of FIG. 1A may be independently programmed by controller 156 to effect an adjustable ride height at each corner of the mobile electronic equipment rack. Ride height contact switches 160 and 162 may be used by controller 156 to detect the angular position of pivoting axle 158.

A maximum ride height, for example, may be detected by controller 156, should contact switch 160 of ride height switch 164 lose contact with its mating contact on pivoting axle 158 when air piston 166 is contracted to its minimum length along axis 168. A minimum ride height, on the other hand, may be detected by controller 156, should contact switch 162 of ride height switch 164 lose contact with its mating contact on pivoting axle 158 when air piston 166 is expanded to its maximum length along axis 170. When both contact switches 160 and 162 make contact with their respective mating contacts, then pivoting axle 158 may be determined by controller 156 to be relatively parallel to the surface that caster 154 is rotating upon.

Expansion/contraction of air piston 166 is accomplished via controller 156 by commanding increased/decreased air pressure within air reservoir 176. For example, increased air pressure may be commanded by controller 156 by: 1) selecting valve 180 as an intake valve; and 2) causing compressor 182 to inflate air reservoir 176 via air tubing 174, which subsequently expands air piston along axis 170 by increasing air pressure within air piston 166. Conversely, decreased air pressure may be commanded by controller 156 by: 1) selecting valve 180 as an exhaust valve; and 2) deflating air reservoir 176, which subsequently contracts air piston along axis 168 by decreasing air pressure within air piston 166.

An additional mode of suspension is provided by the pneumatically sprung swivel caster mechanism of FIG. 1B through the interaction of air piston 166, air reservoir 176, and air tubing 174. In particular, once an equilibrium length of air piston 166 has been established, minute variations in the length of air piston 166 may be absorbed through the elasticity of the walls of air reservoir 176. In one embodiment, for example, the walls of air reservoir 176 may be constructed of an elastic composition, such as rubber, to allow expansion and contraction of the walls of air reservoir 176 along axis 178. Air tubing 174 facilitates a free-flow of air to be exchanged between air piston 166 and air reservoir 176, such that air forced out of air piston 166 during contraction may be collected by air reservoir 176 and air required by air piston 166 during expansion may be provided by air reservoir 176. It should be noted that the walls of air reservoir 176 do not necessarily expand and contract along axis 178, but may expand and contract in any direction defined by the elasticity of the walls of air reservoir 176.

A slight contraction of air piston 166 along axis 168 causes a responsive slight expansion of the walls of air reservoir 176. Conversely, a slight expansion of air piston 166 along axis 170 causes a responsive slight contraction of the walls of air reservoir 176. Due to the elasticity of air reservoir 176, however, the length of air piston 166 is returned to its equilibrium length as defined by the amount of air pressure contained within air reservoir 176. Thus, a spring-like operation is created through the interaction of air piston 166 and air reservoir 176, whereby the elasticity of the walls of air reservoir 176 serves to absorb minute variations in the length of air piston 166 that may be caused by fluctuations of caster 154 along axis 190 in response to the terrain being traversed by caster 154.

Through interaction of air piston 166 and air reservoir 176, therefore, dynamic variations in the position of caster 154 along axis 190 may be absorbed by the elasticity of the walls of air reservoir 176. As such, vibration and shock that may be caused by traversal of rough terrain may be substantially absorbed by the interaction of air piston 166 and air reservoir 176, instead of being transferred to swivel plate 172. Given that swivel plate 172 may be mounted to the bottom surface of platform 120 of the mobile electronic equipment rack of FIG. 1A, the pneumatically sprung swivel caster mechanism of FIG. 1B may further reduce the magnitude of vibration and shock that is transferred to the payload contained within the mobile electronic equipment rack of FIG. 1A.

Figure 1C:
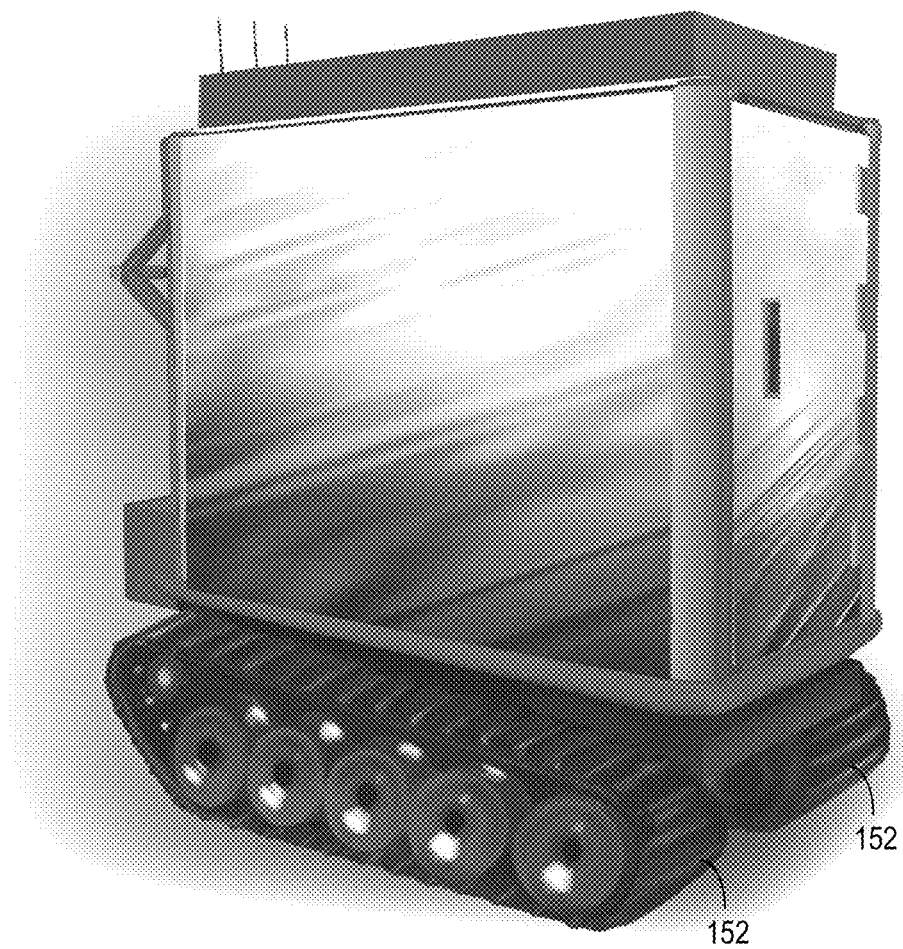
FIG. 1C illustrates an alternate embodiment of a mobile electronic equipment rack.

Turning to FIG. 1C, an alternate mobility mechanism is exemplified, whereby the mobile electronic equipment rack may be transported via a track drive system. Such a mobility system, for example, allows traversal of terrain that would not otherwise be facilitated by the caster mechanisms discussed above in relation to FIGS. 1A and 1B. In particular, given that the gross weight of the mobile electronic equipment rack may exceed several thousands of pounds, a caster based mobility mechanism would prove unacceptable in particularly soft terrain, since each caster would most likely sink into the soft terrain, as opposed to rolling over the top of it. A track drive system, on the other hand, allows the weight of the mobile electronic equipment rack to be more evenly distributed, thus facilitating traversal over soft terrain, as well as other more extreme terrain that is not conducive to castor based mobility systems.

Returning to FIG. 1A, operational power may be supplied to the mobility control systems discussed above as either electrical power, via DC batteries or fuel cells, or conversely, as hydraulic power, via a hydraulic pump. As discussed above, power conditioner 108 may receive any one of a variety of DC and/or AC input power signals. If DC is supplied, for example, then the DC power may be directly applied, or regulated and then applied, to recharge the DC batteries (not shown), which may be responsible for delivering current to activate the transaxle drive (not shown) of mobility control device 106. Alternately, AC power may be accepted by power conditioner 108 and subsequently rectified to produce the DC power levels required to recharge the DC batteries (not shown). Fuel cells may also be utilized instead of DC batteries to enhance the amount of power that may be generated. In one embodiment, fuel cells may provide power to a hydraulic pump to operate the track drive system of FIG. 1C.

Environment proof enclosure 102 may be utilized to maintain interior compartment 104 of the mobile electronic equipment rack within a range of controlled environment specifications. For example, once electronic components are installed within mounting enclosure 122, access hatch 114 may then be closed to seal the electronic components within a temperature controlled, substantially dust free environment. Furthermore, EMI shielding may be installed along the inner surfaces of environment proof enclosure 102, or conversely environment proof enclosure 102 may be manufactured from EMI shielding material, such as fiberglass-reinforced foil, or aluminum, to substantially eliminate EMI ingress/egress.

Still further, noise filtering may also be employed within power conditioner 108, as well as patch panel 116, to substantially eliminate conduction of noise and EMI onto the power and control buses (not shown) within interior compartment 104. In particular, each connector 118 of patch panel 116 may be bulkhead mounted with EMI shielded gaskets and hatch 124 may further be grounded to provide an EMI shield when closed.

It should be noted, that environment proof enclosure 102 may also provide protection against ballistic projectiles by appropriately designing the walls of environment proof enclosure 102. For example, the walls of environment proof enclosure 102 may be implemented with armored materials such as fiberglass, or other composites, such as carbon fiber, ceramic, Kevlar®, etc. In one embodiment, protection against 9 mm projectiles, or the equivalent, may be implemented through appropriate design of environment proof enclosure 102.

Access to interior compartment 104 may be provided by any one of a number of access hatches, such as access hatch 114. As discussed above, authentication of authority to activate access hatch 114 may first be required as a security measure. Access hatch 124 may be similarly provided to allow access to patch panel 116. Access to either of access hatches 114 or 124 may be authorized/unauthorized by the disengagement/engagement of locking mechanisms 130 and 132, respectively. The authorization being predicated upon successful authentication of the particular user who is requesting access.

Various security mechanisms may be employed to authenticate users prior to allowing access to interior compartment 104 and/or patch panel 118. A wireless KVM switch (not shown) mounted within interior compartment 104, for example, may receive a wireless authentication request from a user. In one embodiment, the wireless KVM switch may receive biometric information that is associated with the user, such as a scan of his or her fingerprint, in order to authenticate the user's access. Biometric authentication may also include techniques for measuring and analyzing other physical and behavioral characteristics of a user. Examples of physical characteristics that may be used for physical authentication are eye retina scans, facial patterns, and hand measurements. Alternatively, behavioral characteristics such as signature, gait and typing patterns may also be used for biometric authentication. Hybrid characteristics that share both physical and behavioral characteristics, such as voice, may also be used for biometric authentication.

In an alternate embodiment, authentication may instead be initiated trough activation of a security device, such as a universal serial bus (USB) based flash drive that may insert into an authentication verification device (not shown). The authentication verification device may be mounted externally to environment proof enclosure 102 to allow insertion of a security device, such as the USB based flash drive.

In another embodiment, a biometric scanner (not shown) may be installed within the authentication device (not shown) to obviate the need to use the wireless KVM switch, or other security device, for user authentication. Other embodiments may provide wireless authentication through the use of radio frequency identification (RFID), Bluetooth access control, inductive proximity sensors, etc.

In yet another embodiment, locking mechanisms 130 and 132 may employ electronic cylinders that are void of a keyway, which precludes unauthorized access via mechanical countermeasures. Instead, the cylinders are electronically actuated by a battery powered key that activates the cylinder to conduct an authorization of the key for access. Each key may, for example, contain a list of electronic cylinder identification codes that are compatible with the key. If the identification code of the particular electronic cylinder is not contained within the memory of the key, for example, then access is denied. An audit trail may further be contained within each key and electronic cylinder so that any access requests may be tracked over a certain period of time.

As discussed above, environment control unit 110 may be utilized to maintain interior compartment 104 within a predetermined temperature and humidity range. In one embodiment, environment control unit 110 may be implemented as an HVAC unit operating within a closed circuit consisting of, for example, a compressor, an expansion valve, and two heat exchangers, e.g., an evaporator and a condenser. A volatile liquid, such as a refrigerant, circulates through the four components and is delivered to the compressor after having absorbed heat from interior compartment 104. The refrigerant exits the compressor as a hot vapor, where it is then condensed into a warm liquid. A flow control valve regulates the flow of the refrigerant, allowing it to expand into a cold liquid before returning to interior compartment 104 to complete the cycle. Air, having been cooled by the cold liquid, is then circulated via a ducted channel for optimal cooling of the electronic components mounted within interior compartment 104.

Environment control unit 110 may itself be mounted onto a hinged access hatch that is similar to access hatch 114. Conversely, environmental control unit 110 may be attached via slides (not shown) that allow environmental control unit 110 to slidably engage/disengage with environment proof enclosure 102. As such, authenticated egress/ingress may be allowed from/to interior compartment 104 at the opposite end of access hatch 114 to facilitate access to the rear end of electronic components mounted to mounting enclosure 122. It should be noted, that environment control unit 110 may also be installed on any other side of environment proof enclosure 102 as may be required by a particular implementation. For example, the size and weight of environment control unit 110 may require that it be mounted on top of environment proof enclosure 102 in order to provide optimal weight distribution for improved stability.

It is noted that portions of the refrigeration loop, e.g., expansion valve and associated cooling coils, are not necessarily bundled within environment control unit 110. Instead, such refrigeration loop components may be distributed throughout the environment proof enclosure, so as to position each component where they best serve space, cooling, acoustic, and maintenance requirements of the system design. For example, refrigeration loop components may be installed within the air plenum of the environment proof enclosure, as discussed in more detail below in relation to FIG. 9.

Operation of electronic components mounted to mounting enclosure 122 are intended to be operated while all access hatches are secured. Given that patch panel 116 is implemented with water resistant connectors and attachments, however, it is understood that hatch 124 may remain open while the electronic equipment rack of FIGS. 1A and 1C are operational, even while operating in an environment susceptible to atmospheric precipitation.

As discussed above, the operational power applied to power conditioner 18 may be derived from AC power grids operating at a plurality of amplitudes, e.g., 110 VAC or 220 VAC, and a plurality of frequencies, e.g., 50 Hz or 60 Hz. In alternative embodiments, power conditioner 108 may also be utilized in aviation applications, where the power grid may be operating at a DC potential of 28 VDC, or conversely, 115/230 VAC operating at 400 Hz or 480 Hz.

In any event, once the electronic components are operational, access to their respective I/O ports may be provided in one of two formats. First, MIMO wireless access point (WAP) 112, for example, may be used to access the data/computational resources of the electronic components. MIMO WAP 112 implements two or more antennas to send and receive information using, for example, orthogonal frequency division multiplexing (OFDM) to significantly increase the data throughput as compared to conventional wireless access technologies.

A MIMO router may be used in conjunction with MIMO WAP 112 to provide/retrieve information to/from the electronic components that are mounted to mounting enclosure 122. The MIMO router may support the standard Wired Equivalent Privacy (WEP) and/or the advanced Wi-Fi Protected Access (WPA) for data encryption. Additional security features may also include Media Access Control (MAC) and Internet Protocol (IP) filtering for limiting network access based on MAC Address or IP Address.

Wired access to the data/computational resources of the electronic components of the mobile electronic equipment rack may also be implemented via water resistant patch panel 116. Connectors 118 may represent a wide variety of data I/O connectors, such as for example, category 5 and/or 6 connectors, as may be used to support Gigabit Ethernet applications. Fiber optic communications may also be supported by patch panel 116 in support of, for example, a synchronous optical network (SONET) ring. It is appreciated that any number of I/O connectivity options, such as radio frequency (RF) connectors, or KVM connectors, may also be provided by patch panel 116.

In operation, the mobile electronic equipment rack of FIGS. 1A and 1C may include use as a mobile, high-density server, such as a blade server. In particular, mounting enclosure 122 may be adapted to mount a plurality of blade server chassis, where each chassis may include a plurality of modular electronic circuit boards known as server blades. Each server blade contains one or more microprocessors, memory, and other electronics, and is generally intended for a specific application. The server blades may also provide integrated network controllers, a fiber optic host bus adaptor (HBA), and other I/O ports to facilitate data exchange.

Each server blade may also include an advanced technology attachment (ATA) or small computer system interface (SCSI) disk drive. For additional storage, the blade servers may connect to a storage pool (via, for example, the MIMO or patch panel interface), where the storage pool is facilitated by a network attached storage (NAS), fiber channel, or Internet SCSI (iSCSI) storage area network (SAN). Blade servers mounted within the mobile electronic equipment rack of FIGS. 1A and 1C are effective to consolidate several blade servers into a single chassis and also to consolidate associated resources, such as storage and networking equipment, into a smaller architecture that can be managed through a single interface, e.g., the MIMO or patch panel interface, as discussed above.

Furthermore, multiple blade server chassis may be mounted and configured for operation before mobilization. In such an instance, pre-configured blade servers may be mobilized in a completely secure environment, protected from vibration induced damage during transportation, and quickly energized within a temperature and humidity controlled environment virtually anywhere in the world. In addition, the blade server network may be quickly relocated in a safe, orderly, and efficient manner as may be required by many government and/or commercial applications.

One such commercial application, for example, includes use as a storage medium for digitized audio, graphical, and video information in support of media, television, and motion picture operations. In particular, as new standards are developed for digital technologies in audio, still pictures, motion pictures, and television, digital storage solutions become increasingly necessary. As such, the mobile equipment rack of FIGS. 1A and 1C may be populated with blade servers and deployed to support digital video and audio storage at various stages of digital data operations, e.g., acquisition, production, control-room editing, transmission, and reception.

Thus, the mobile equipment rack of FIGS. 1A and 1C may be effectively deployed as mobile video storage servers, such that when fully configured with blade servers as discussed above, may provide, for example, up to 57 terabytes of audio/video digital storage capability. As such, wireless camera feeds to the MIMO WAP 112 of the video storage server may be implemented during, for example, on-location filming to facilitate direct digital storage of several days, or even several weeks, of direct digital audio/video recordings.

Once its storage capacity has been reached, the mobile video storage server may be relocated to a main control room, whereby direct editing of the digital content may be achieved. Conversely, the mobile video storage server may remain deployed on-location to support editing/playback operations at the actual filming site, whereby editing/playback operations may be facilitated through digital data access via either of MIMO WAP 112 or wired patch panel 116.

It should be noted, that the mobile electronic equipment rack of FIGS. 1A and 1C may be implemented with low-profile suspension, as discussed in more detail below, which provides for a reduced height. Furthermore, the width of the mobile electronic equipment rack of FIG. 1A allows entry into most standard sized doorways. In one embodiment, for example, physical dimensions of the mobile electronic equipment rack of FIG. 1A provides approximately 58" in height, 27" in width, and 54" in length. Thus, access to the interiors of most standard buildings is facilitated by the relatively small profile dimensions of the mobile electronic equipment rack of FIG. 1A, which enhances the versatility provided to its commercial, industrial, and governmental users.

Figure 2:
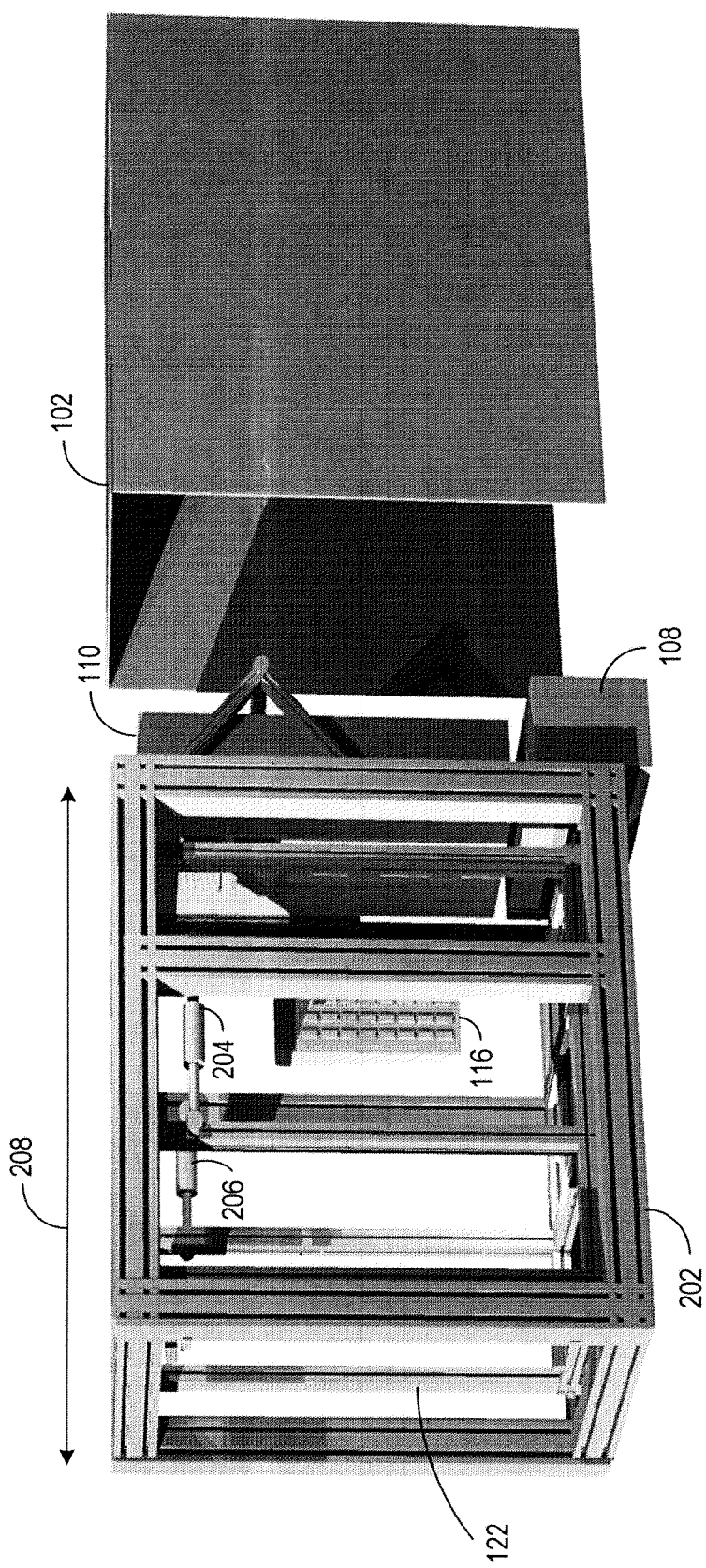
FIG. 2 illustrates an exploded view of the mobile electronic equipment rack of FIGS. 1A and 1B.

Turning to FIG. 2, an exploded view of the various enclosures are illustrated, whereby a portion of environment proof enclosure 102 is pulled away to reveal mounting enclosure 122 and structural enclosure 202. As discussed in more detail below, structural enclosure 202 may be an optional component when the various modes of suspension are not implemented within the enclosure. Also exemplified, is the rear view of patch panel 116 as well as a side view of environment control unit 110 and power conditioner 108.

As can be seen by inspection, mounting enclosure 122 is enclosed within structural enclosure 202. Both mounting enclosure 122 and structural enclosure 202 are composed of an anodized metal, such as aluminum or steel, and may be tig welded for strength, or conversely, may utilize other coupling techniques such as bolted or clamped connections. As discussed in more detail below, mounting enclosure 122 "floats" within the spatial confines as defined by structural enclosure 202 through the use of a multi-axis suspension system. That is to say, for example, that multiple modes of support are used to create a multi-axis, variable weight, magnetorheological isolation system, which seeks to maintain mounting enclosure 122, and electronic components (not shown) mounted therein, substantially isolated from kinetic energy transfer.

Structural enclosure 202 is "hard" mounted to platform 120 (not shown in FIG. 2), while mounting enclosure 122 is "soft" mounted to both platform 120 (not shown in FIG. 2) and structural enclosure 202. As such, kinetic energy may be directly transferred to structural enclosure 202 during transportation, or other acceleration generation events, due to the "hard" mounting relationship between platform 120 and structural enclosure 202. In contrast, however, substantially all of the kinetic energy that may be transferred to structural enclosure 202 along a longitudinal component as defined by directional vector 208 is virtually absorbed by supports 204 and 206.

As discussed in more detail below, supports 204 and 206 may be implemented as magnetorheological dampers, pneumatic springs, or a combination of both. In addition, while only two supports are illustrated, more support quantities may be added. In one embodiment, for example, four pneumatic springs may be situated at, or near, each corner of structural enclosure 202 and mounting enclosure 122, while two MR supports may be co-located with two of the pneumatic springs to provide damper resistance. In operation, the MR supports provide damper resistance against the transfer of kinetic energy along longitudinal axis 208, while the pneumatic springs seek to maintain mounting enclosure 122 and its contents centered within structural enclosure 202 along longitudinal axis 208.

MR supports represent a first mode of "soft" support, whereby relative motion between mounting enclosure 122 and supporting enclosure 202 is dampened by operation of the MR supports. A first end of the MR supports are coupled to an outer portion of mounting enclosure 122 as illustrated, while a second end of the MR supports are coupled to an inner portion of structural enclosure 202 as illustrated. The coupling between the outer portion of mounting enclosure 122 and the inner portion of structural enclosure 202 is said to be "soft", since substantially all of the kinetic energy that is transferred by the relative motion between mounting enclosure 122 and supporting enclosure 202 is dampened by operation of the MR supports.

The MR supports utilize an MR fluid, whereby a viscosity change in the MR fluid is effected in the presence of a magnetic field to increase/decrease the dampening effects of the MR supports. In particular, a control unit (not shown) transmits a pulse width modulated (PWM) signal to a magnetic coil that surrounds the MR fluid contained within a monotube housing of the MR supports. The PWM signal parameters, such as duty cycle and amplitude, may be predetermined through the use of a potentiometer (not shown) and may be preset to a predetermined value by an appropriate voltage as selected by the potentiometer.

By increasing the duty cycle of the PWM signal through forward potentiometer control, for example, the control unit imparts an increased magnitude of time varying current to the magnetic coil, which in turn imparts an increased magnetic field around the MR fluid. In response, the damper forces exerted by the MR supports increase proportionally. Conversely, by decreasing the duty cycle of the PWM signal through reverse potentiometer control, the control unit imparts a decreased magnitude of time varying current to the magnetic coil, which in turn imparts a decreased magnetic field around the MR fluid. In response, the damper forces exerted by the MR supports decrease proportionally.

As discussed above in relation to the operation of the pneumatic spring swivel caster mechanism of FIG. 1B, pneumatic springs may also be utilized in combination with the MR supports to provide an added dimension of suspension. Through interaction of each air piston and air reservoir, i.e., the pneumatic spring mechanism, any variation of the position of mounting enclosure 122 relative to structural enclosure 202 along longitudinal axis 208 may be opposed. As such, the pneumatic spring seeks to maintain the position of mounting enclosure 122 within an equilibrium position relative to structural enclosure 202 along longitudinal axis 208.

Figure 3:
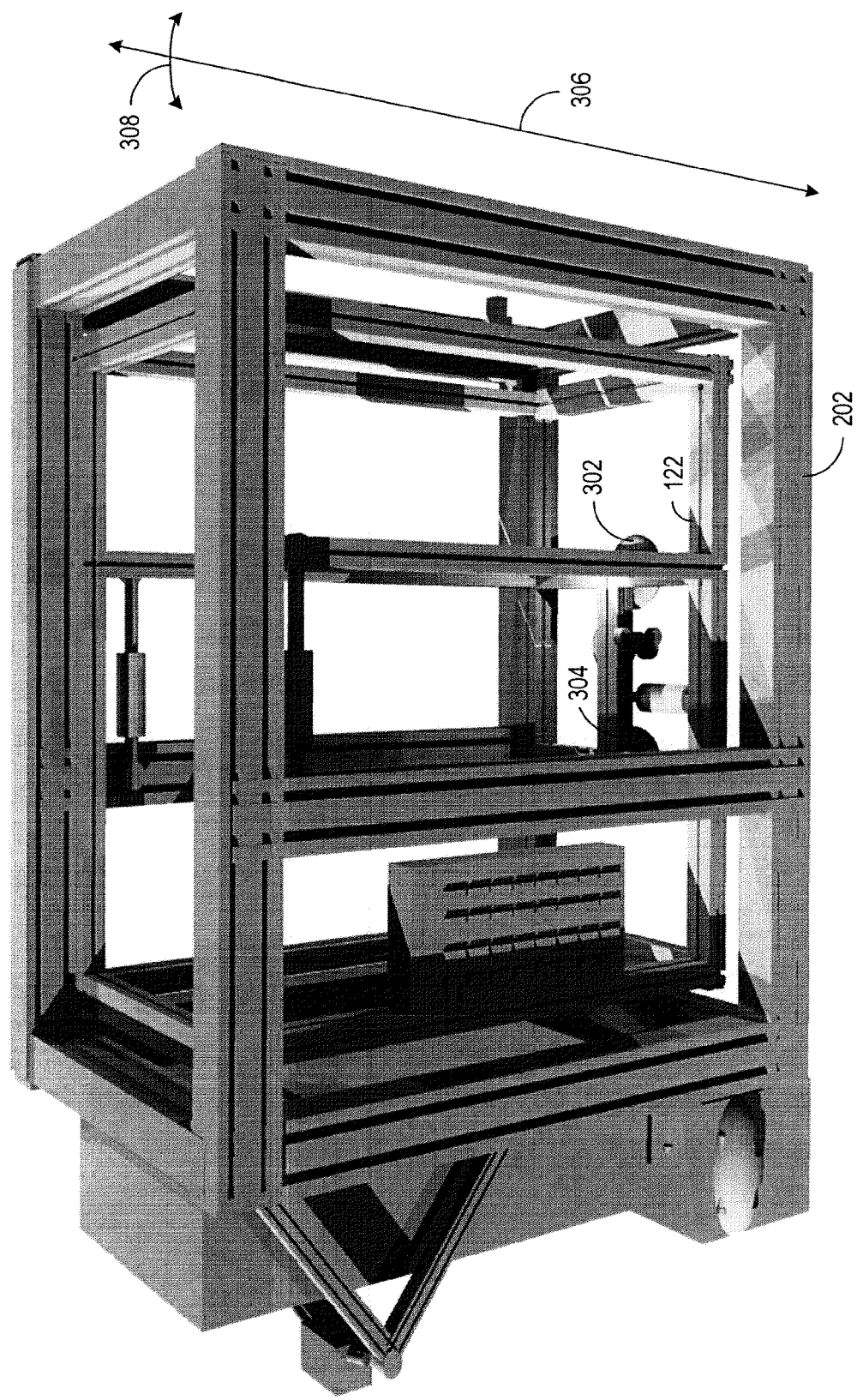
FIG. 3 illustrates an alternate view of the mobile electronic equipment rack of FIGS. 1A and 1B.

Turning to FIG. 3, a vertical component of isolation is illustrated along directional vector 306. In particular, support components 302 and 304 are "soft" coupled to the bottom side of mounting enclosure 122 and platform 120 (not shown), such that support is provided to mounting enclosure 122, and each electronic component (not shown) mounted therein, in direct proportion to the weight of the combined mounting enclosure 122 and electronic component payload. That is to say, that support components 302 and 304 provide weight adaptive support along the vertical directional vector 306 in order to maintain a substantially fixed position of mounting enclosure 122 that is virtually independent of the combined weight of mounting enclosure 122 and associated payload.

Furthermore, support components 302 and 304 provide flexibility along longitudinal axis 308, in order to account for any weight discrepancies that exist along longitudinal axis 308. For example, electronic components may be mounted within mounting enclosure 122, such that more weight is transferred to support component 302 as compared to the amount of weight that is transferred to support component 304. In this instance, the amount of weight bearing support that is provided by support component 302 is greater than the weight bearing support that is provided by support component 304.

Conversely, electronic components may be mounted within mounting enclosure 122, such that more weight is transferred to support component 304 as compared to the amount of weight that is transferred to support component 302. In this instance, the amount of weight bearing support that is provided by support component 304 is greater than the weight bearing support that is provided by support component 302. Thus, in either instance, the amount of weight bearing support that is provided by supports 302 and 304 is weight adaptive in order to maintain mounting enclosure 122 in a relatively level attitude irrespective of the relative positions of platform 120 (not shown) and/or support enclosure 202.

It should be noted, that supports 302 and 304 provide an additional degree of freedom along an axial component as defined by directional vector 308. In particular, supports 302 and 304 provide a degree of freedom to allow operation of supports 204 and 206 as discussed above in relation to FIG. 2. Thus, supports 302, 304, 204, and 206 interoperate within a two-dimensional range of movement to provide suspension along axial components defined by directional vectors 306 and 308.

A third dimension of suspension along an axial component that is orthogonal to both directional vectors 308 and 306 may be provided to substantially isolate mounting enclosure 122 from lateral acceleration forces. In such an instance, dampening MR supports and pneumatic springs, such as those utilized for supports 204 and 206, may be coupled between mounting enclosure 122 and support enclosure 202, in a perpendicular arrangement, to provide dampened/pneumatic spring suspension along a lateral axis that is perpendicular to longitudinal vector component 308 and vertical vector component 306.

In one embodiment, support components 302 and 304 may include a pneumatic shock absorption device, whereby a deflection of mounting enclosure 122, due to the addition or subtraction of weight, may be sensed and corrected. Magnetic sensors (not shown), for example, may be mounted to both mounting enclosure 122 and support enclosure 202 to detect a change in position of mounting enclosure 122 relative to support enclosure 202 along directional vector 306. In such an instance, feedback provided by the magnetic sensors (not shown) may be provided to a compressor (not shown) to inflate/deflate pneumatic support components 302 and 304 so that the axial position of mounting enclosure 122 relative to support enclosure 202 along directional vector 306 is maintained within a predetermined stroke range.

An additional layer of suspension may be added, for example, to one or more of supports 204, 206, 302, and 304. In particular, elastomeric mounts may be utilized between supports 204, 206, 302, 304 and their respective mounting surfaces to provide an additional layer of vibration/shock absorption. Furthermore, elastomeric compounds having varying resonant frequencies may be selected to optimize the operation of the suspension system. For example, given that the MR dampers are responsive up to a nominal frequency of, e.g., 40 hertz, the resonant frequency of each elastomeric mount may be selected to be higher than the operational frequency range of the MR dampers. Thus, by appropriate staggering of resonant frequencies, elastomeric mounts may be selected to extend the operational bandwidth of the suspension system to well beyond the operational frequency range of the MR dampers.

Figure 4A:
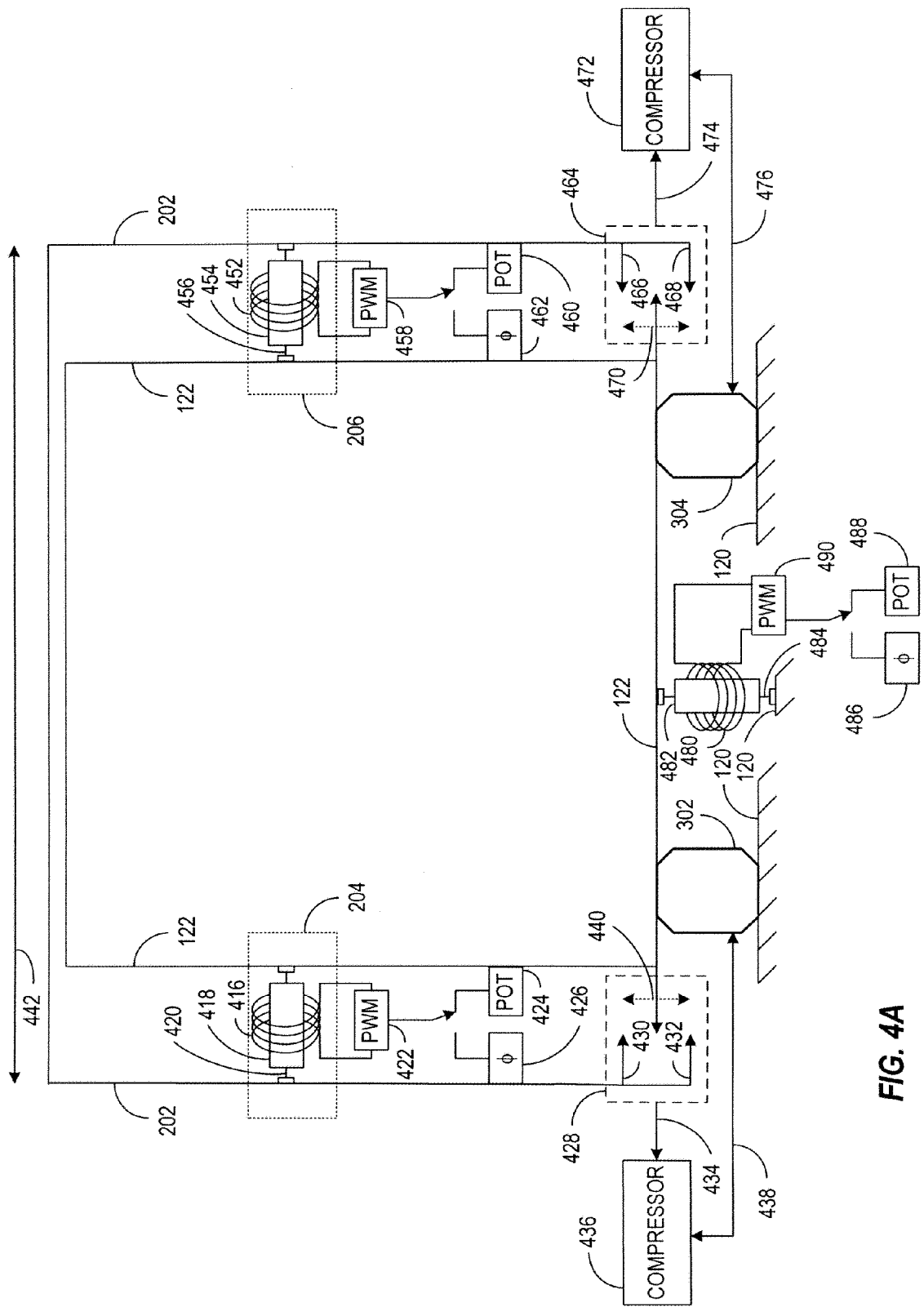
FIG. 4A illustrates an exemplary schematic diagram of a multi-axis suspension system.

Turning to FIG. 4A, an exemplary functional schematic diagram of one embodiment of a multi-axis suspension system is illustrated. It should be noted, that orientation of components in FIG. 4A do not necessarily denote their spatial configuration, but rather represent their functional relationship with respect to one another. Explanation of the operation of the multi-axis suspension system of FIG. 4A is facilitated in view of FIGS. 1A, 1C, and 2-3. Pneumatic support components 302 and 304 are coupled between platform 120 and the bottom portion of mounting enclosure 122 to provide a vertical component of support along directional vectors 440 and 470, while also providing flexibility of movement along longitudinal axis 442.

Position detectors 428 and 464 utilize, for example, magnetic sensors 430,432 and 466,468 to maintain mounting enclosure 122 within a range of movement illustrated by vertical directional vectors 440 and 470. In particular, position signals 434 and 474 provide an indication to a control unit (not shown) associated with compressors 436 and 472, respectively, as to the position of mounting enclosure 122 relative to support enclosure 202. If the position of mounting enclosure 122 is centered between sensors 430 and 432, for example, then pneumatic support 302 is considered to be in an equilibrium position and no further action is taken. Similarly, if the position of mounting enclosure 122 is centered between sensors 466 and 468, for example, then pneumatic support 304 is considered to be in an equilibrium position and no further action is taken.

If, however, the position of mounting enclosure 122 indicates a position 440 that is below equilibrium, then position signal 434 provides the requisite indication to the control unit (not shown) associated with compressor 436 to correct the over-weight condition. In particular, position signal 434 causes compressor 436 to inflate pneumatic support 302, i.e., increase pressure, via line 438 until pneumatic support 302 is inflated to the equilibrium position. Similarly, if the position of mounting enclosure 122 indicates a position 470 that is below equilibrium, then position signal 474 provides the requisite indication to the control unit (not shown) associated with compressor 472 to correct the over-weight condition. In particular, position signal 474 causes compressor 472 to inflate pneumatic support 304, i.e., increase pressure, via line 476 until pneumatic support 304 is inflated to the equilibrium position.

If, on the other hand, the position of mounting enclosure 122 indicates a position 440 that is above equilibrium, then position signal 434 provides the requisite indication to compressor 436 to correct the under-weight condition. In particular, position signal 434 causes the control unit (not shown) associated with compressor 436 to deflate pneumatic support 302, i.e., decrease pressure, via line 438 until pneumatic support 302 is deflated to the equilibrium position. Similarly, if the position of mounting enclosure 122 indicates a position 470 that is above equilibrium, then position signal 474 provides the requisite indication to the control unit (not shown) associated with compressor 472 to correct the under-weight condition. In particular, position signal 474 causes compressor 472 to deflate pneumatic support 304, i.e., decrease pressure, via line 476 until pneumatic support 304 is deflated to an equilibrium position.

It should be noted, that pneumatic supports 302 and 304 may operate independently of one another. That is to say, for example, that the extent of inflation/deflation of pneumatic supports 302 and 304 may be unequal, so that unequal weight distribution of mounting enclosure 122 and its associated payload (not shown) along longitudinal axis 442 may nevertheless be equalized. Thus, regardless of the weight distribution, the position of mounting enclosure 122 may be substantially leveled with respect to support enclosure 202 and/or platform 120 to implement a first mode, or coarse, suspension control.

Acting in conjunction with pneumatic supports 302 and 304, is the second mode, or fine, suspension control. Fine suspension along directional vectors 440 and 470 is implemented by, for example, an MR support as exemplified by components 480-484 and MR damper control components 486-490. It should be noted, that the MR support as exemplified by components 480-484 actuate along a vertical axis that is aligned with directional vectors 440 and 470. That is to say, for example, that piston 484 extends and retracts through a stroke of motion that is substantially parallel with directional vectors 440 and 470.

In operation, piston 484 extends and retracts through its stroke of motion, while being subjected to a variable damper force. In particular, monotube housing 482 is filled with an MR fluid and is surrounded by magnetic coil 480. The magnetic field created by magnetic coil 480 causes a viscosity change in the MR fluid to exert a programmable range of damper forces on piston 484, where the viscosity changes in the MR fluid are effected by applying a variable magnitude of AC current to magnetic coil 480.

In operation, PWM 490 may receive either a primarily static, or a primarily dynamic, control signal from one of two PWM control sources. In a first embodiment, PWM 490 receives a primarily static control signal from potentiometer 488, which is then used to statically program a PWM signal having a duty cycle that is proportional to the statically programmed control signal from potentiometer 488. If low damper force is required, for example, then the appropriate control signal from potentiometer 488 may be statically programmed to produce a relatively low duty cycle, PWM signal. In response, a relatively low magnitude of AC current is imparted to magnetic coil 480, which in turn imparts a relatively low magnitude magnetic field around monotube housing 482. Accordingly, the MR fluid contained within monotube housing 482 reactively assumes a relatively low viscosity, which in turn provides a relatively low damper force to oppose the movement of piston 484.

If a relatively greater damper force is required, on the other hand, then the appropriate control signal from potentiometer 488 may be statically programmed to cause PWM 490 to transmit a relatively high duty cycle, PWM signal. In response, a relatively high magnitude of AC current is imparted to magnetic coil 480, which in turn imparts a relatively high magnitude magnetic field around monotube housing 482. Accordingly, the MR fluid contained within monotube housing 482 reactively assumes a relatively high viscosity, which in turn provides a relatively high damper force opposing the movement of piston 484.

In an alternate embodiment, a primarily dynamic control signal is provided to PWM 490, to effect an adaptively programmed mode of suspension, which is effective to isolate mounting enclosure 406 and its associated payload (not shown) from low frequency vibration operating in the range of a few cycles per second to several hundred cycles per second. In operation, accelerometer 486 measures acceleration forces along directional vectors 440 and 470 and provides an adaptive control signal to PWM 490 that is indicative of the acceleration forces measured. A low magnitude of instantaneous acceleration force may result in an adaptively programmed low duty cycle PWM signal, whereas a high magnitude of instantaneous acceleration force may result in an adaptively programmed high duty cycle PWM signal. Thus, acceleration forces across a wide vibration bandwidth may be adaptively dampened through the adaptive feedback provided by accelerometer 486 to PWM 490. The viscosity of the MR fluid then reacts to the corresponding changes in the magnetic field to exert proportional damper forces on piston 484 as discussed above.

It can be seen, therefore, that pneumatic supports 302 and 304 combine with MR support functions associated with components 480-490 to provide coarse and fine suspension control. Coarse suspension control is provided by pneumatic supports 302 and 304 to provide weight management of mounting enclosure 122 and its associated payload (not shown). Once the position of mounting enclosure 122 has been substantially equalized with respect to support enclosure 202 and/or platform 120, then fine suspension control is implemented via components 480-490 to "fine tune" the position in either of a programmably static, or adaptive, fashion.

MR supports may also be used to isolate kinetic energy from being transferred to mounting enclosure 122 and its associated payload (not shown) along a longitudinal axis depicted by directional vector 442. In particular, components 416-426 may combine to form MR support 204 of FIG. 2 to implement either programmably static or adaptive isolation from kinetic energy along directional vector 442. Additionally, components 452-462 may combine to form MR support 206 of FIG. 2 to implement either programmably static or adaptive isolation from kinetic energy along directional vector 442. Operation of components 416-426 and components 452-462 operate substantially as discussed above in relation to components 480-490 in either of a programmably static, or adaptive, fashion.

A third component of suspension may also be provided for mounting enclosure 122 and it associated payload (not shown). In particular, a component of suspension may be provided along a directional vector that is orthogonal to directional vectors 440, 470, and 442. The suspension, for example, may also be provided via MR supports, as discussed above, to provide a third axis of suspension to substantially eliminate kinetic energy transfer along a lateral axis relative to mounting enclosure 122.

Figure 4B:
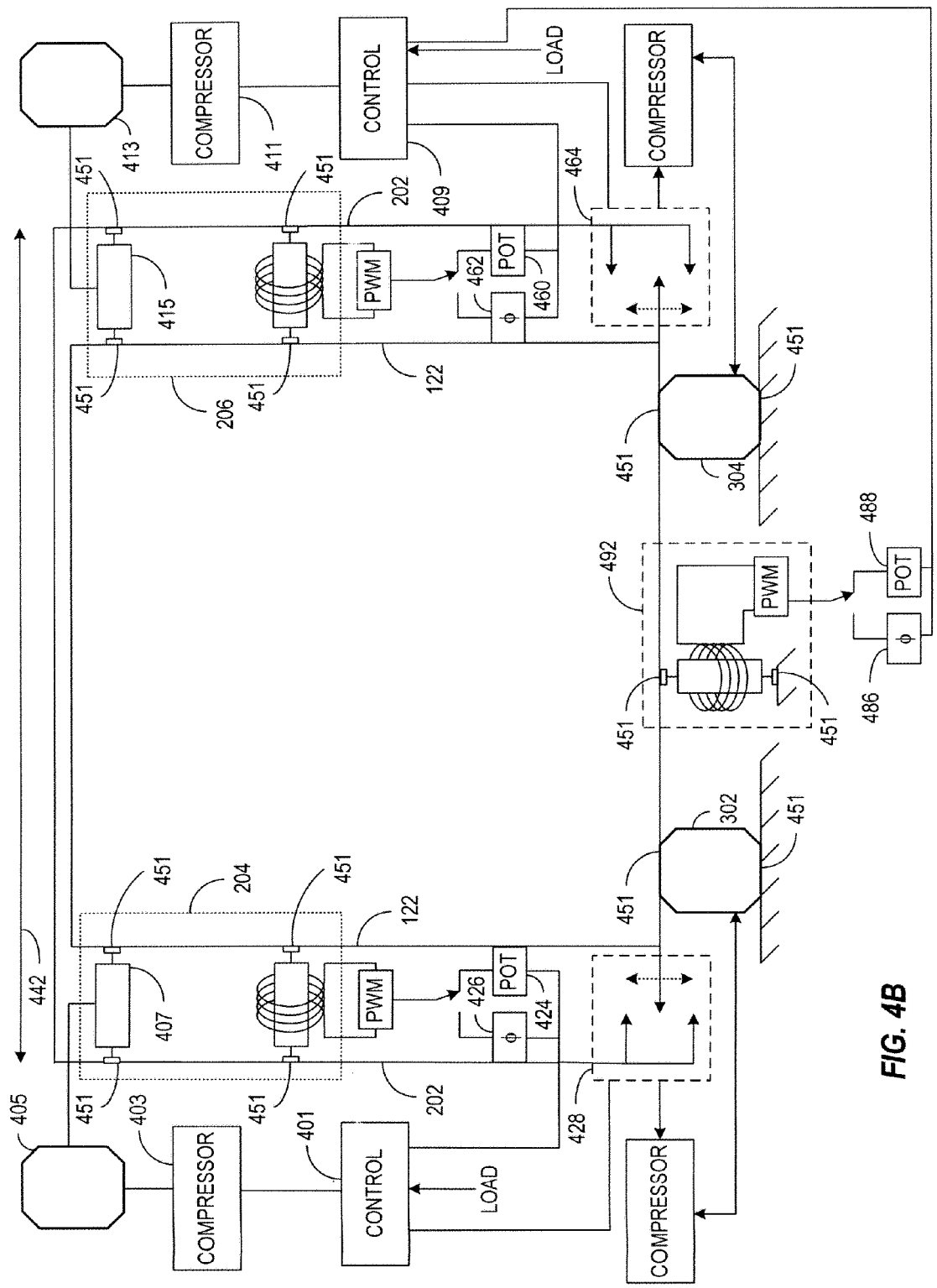
FIG. 4B illustrates an exemplary schematic diagram of an alternate, multi-axis suspension system.

Turning to FIG. 4B, an alternate embodiment of a multi-axis suspension system is exemplified. As discussed above, supports 204 and 206 (and other supports, if needed) may be comprised of both MR supports and pneumatic spring supports. Air piston 407, air reservoir 405, compressor 403, and control block 401 combine to form the programmable pneumatic spring of support 204, while air piston 415, air reservoir 413, compressor 411, and control block 409 combine to form the programmable pneumatic spring of support 206.

Through interaction of each air piston, air reservoir, and control module, i.e., the programmable pneumatic spring, any variation of the position of mounting enclosure 122 relative to structural enclosure 202 along longitudinal axis 442 may be opposed. As such, the air piston/air reservoir combination operates as a position equalization device to maintain the position of mounting enclosure 122 within an equilibrium position relative to structural enclosure 202 along longitudinal axis 442.

Air reservoirs 405 and 413 may be filled to a nominal air pressure, via compressors 403 and 411, respectively, to maintain an equilibrium length of air pistons 407 and 415. Once an equilibrium length of air pistons 407 and 415 has been established, minute variations in the length of air pistons 407 and 415 may be substantially absorbed through the elasticity of the walls of air reservoirs 405 and 413. In one embodiment, for example, the walls of air reservoirs 405 and 413 may be constructed of an elastic composition, such as rubber, to allow expansion and contraction of the walls of air reservoirs 405 and 413. Air tubing connecting air pistons 407,415 to air reservoirs 405,413, facilitates a free-flow of air to be exchanged, such that air forced out of air pistons 407 and 415 during contraction may be collected by air reservoirs 405 and 413, respectively, and air required by air pistons 407 and 415 during expansion may be provided by air reservoirs 405 and 413, respectively.

As such, a slight contraction of air pistons 407 and 415 along axis 442 causes a responsive slight expansion of the walls of air reservoirs 405 and 413. Conversely, a slight expansion of air pistons 407 and 415 along axis 442 causes a responsive slight contraction of the walls of air reservoirs 405 and 413. Thus, a spring-like operation is created through the interaction of air pistons 407,415 and air reservoirs 405,413, whereby the elasticity of the walls of air reservoirs 405,413 serves to absorb minute variations in the length of air pistons 407,415. As such, the pneumatic springs of supports 204 and 206 seek to center mounting enclosure 122 within structural enclosure 202 along longitudinal axis 442.

Control blocks 401 and 409 may additionally provide other features. In particular, a sleep mode may be provided, whereby all operational power to the suspension system may be gated off to provide a power conservation mode. A wake-up feature may also be provided, whereby for example, a piezoelectric sensor (not shown) detects movement of the mobile electronic equipment rack during the sleep mode. Once awakened, operational power may be restored and sensors 428 and 464, or some other weight sensor, may be queried by control blocks 401 and 409 for weight information relating to the weight of mounting enclosure 122 and associated payload. Once known, the weight information may be utilized by control blocks 401 and 409 to individually program potentiometers 424, 460, and 488, or accelerometers 426, 462, and 486, to select the damper resistance of their respective MR supports to an optimal damper resistance value that is based upon the weight measurement.

In an alternate embodiment, signal LOAD may be received from an external source that is indicative of weight information relating to the weight of mounting enclosure 122 and associated payload. The weight information provided by signal LOAD may then be utilized by control blocks 401 and 409 to individually program potentiometers 424, 460, and 488, or accelerometers 426, 462, and 486, to select the damper resistance of their respective MR supports to an optimal resistance value that is based upon signal LOAD. It should be noted, that the damper resistance of each MR support may be individually programmed by control blocks 401 and 409 as necessary.

As discussed above, adaptive fine suspension control may be effected to dampen kinetic energy transfer to mounting enclosure 122. Accelerometers 426, 462, and 486 may be implemented to detect, and subsequently provide, an acceleration feedback control signal that is indicative of the time-varying attributes of acceleration excitations being applied to mounting enclosure 122. Control blocks 401,409 may then continually analyze the acceleration feedback control signal to determine the nature of the acceleration forces being applied.

For example, control blocks 401,409 may apply a fast Fourier transform (FFT) to the acceleration feedback control signals provided by accelerometers 426, 462, and 486 to determine the spectral content of vibration that is generated by the acceleration excitations. As such, fine suspension control may be adapted through the FFT analysis of control blocks 401,409 to provide wide vibration bandwidth isolation to mounting enclosure 122.

Harmonic components of vibration may also be analyzed to determine the time varying characteristics of the vibration. In particular, the power spectra of the vibration may be analyzed using the FFT algorithm to determine signal strength in designated frequency bands, i.e., FFT bins, of the FFT output. A quantitative relationship between the vibration amplitude in the time domain and the associated spectral amplitude in the frequency domain may then be obtained to optimize the kinetic energy absorption performance.

For example, if the power spectra of the vibration is confined to relatively few FFT bins, then the acceleration excitation may be characterized as a steady state excitation having a sinusoidal property centered about a substantially constant frequency. As such, the fine suspension devices of supports 204, 206, and 492 may be optimized to dampen vibration at the steady state excitation frequency by appropriate control of its damper force via control blocks 401,409.

If the power spectra of the vibration is not confined to a relatively few FFT bins, but is rather spread out across multiple FFT bins, then the acceleration excitation may instead be characterized as a step change in mounting enclosure 122 displacement, such as may be caused by traversing rough terrain. In such an instance, the damper force of the fine suspension devices of supports 204, 206, and 492 may be increased by control blocks 401,409 for optimum damper force at fundamental and harmonic frequencies of vibration excitation. Once the vibration impulse is dampened, control blocks 401,409 may return the fine suspension devices of supports 204, 206, and 492 to a steady state mode of operation as discussed above.

In addition, control blocks 401,409 may continuously process FFT data to achieve a quiescent mode of operation, whereby optimized kinetic energy absorption across a wide bandwidth of vibration excitation may be further facilitated. That is to say, for example, that averaging of the FFT data may yield an optimized suspension control signal from control blocks 401,409, such that the damper force of the fine suspension devices of supports 204, 206, and 492 may be maintained at a nominal level between the steady state response and the step change response as discussed above.

Optimized suspension control in this context means that the reaction time of the fine suspension devices of supports 204, 206, and 492 is minimized due to the quiescent mode of operation. In particular, since the fine suspension devices of supports 204, 206, and 492 are programmed to exhibit a nominal damper force, the reaction time to achieve minimum or maximum damper resistance is essentially cut in half, assuming that the nominal damper force selected represents an average damper force across the entire dynamic range of damper force of the fine suspension devices of supports 204, 206, and 492.

In addition, weight information received by control blocks 401,409 from sensors 428,464, signal LOAD, or from some other weight sensing device, may also be used to program the nominal damper resistance. In particular, performance of the fine suspension devices of supports 204, 206, and 492 may be optimized by selecting a nominal damper resistance that is proportional to the weight of mounting enclosure 122.

As discussed above, a layer of elastomeric material 451 may be used between supports 204, 206, 302, 304 and their respective mounting surfaces to provide additional vibration/shock absorption. Furthermore, elastomeric compounds having varying resonant frequencies may be selected to optimize the operation of the suspension system. For example, given that the MR dampers are responsive up to a nominal frequency of e.g., 40 hertz, the resonant frequency of the elastomeric material may be individually selected to be higher than the operational frequency range of the MR dampers. Thus, by appropriate staggering of resonant frequencies, each individual elastomeric mount 451 may be selected to extend the operational bandwidth of the suspension system to well beyond the operational frequency range of the MR dampers.

Figure 5:
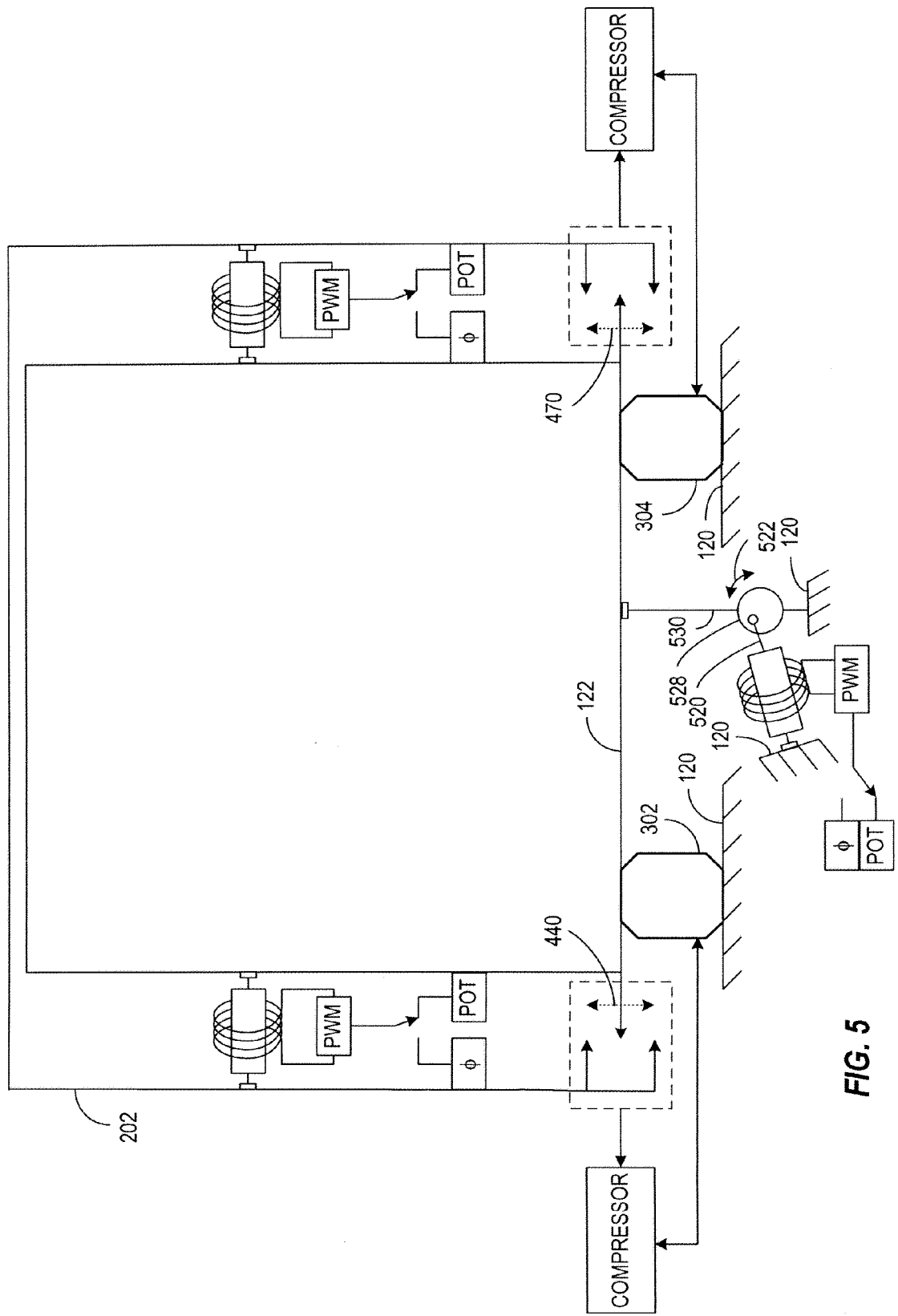
FIG. 5 illustrates an exemplary schematic diagram of an alternate, multi-axis suspension system.

Turning to FIG. 5, an alternate embodiment is exemplified in which a vertical component of suspension along directional vectors 440 and 470 is provided in a space saving fashion. In particular, the vertical component of suspension is provided in a manner that minimizes the amount of vertical space required between mounting enclosure 122 and platform 120. It should be noted, that while pneumatic spring mechanisms are not illustrated in FIG. 5, they may nevertheless be utilized in FIG. 5 in the same manner as discussed above in relation to FIG. 4B.

In operation, coarse position control is implemented by pneumatic supports 302 and 304 to maintain an equilibrium position of mounting enclosure 122 with respect to support enclosure 202 along directional vectors 440 and 470 as discussed above in relation to FIG. 4. Fine position control, however, utilizes an MR support that is not fixed in a vertical relationship with respect to mounting enclosure 122. Instead, the MR support is coupled between support enclosure 202 and/or platform 120 and right-angle gear drive 528 to reduce the vertical relationship of the MR support between mounting enclosure 122 and platform 120.

As such, actuation of the MR support does not extend piston 520 along a range of stroke whose direction is parallel to directional vectors 440 and 470. Instead, piston 520 extends along a range of stroke whose direction may range between one that is orthogonal to directional vectors 440 and 470 and one that is just short of parallel to directional vectors 440 and 470. As the direction of the range of stroke of piston 520 approaches one that is orthogonal to directional vectors 440 and 470, the amount of vertical space required between mounting enclosure 122 and platform 120 reduces in proportion to the sine of the angle formed between the direction of stroke of piston 520 and platform 120.

In operation, the range of stroke of piston 520 actuates right-angle gear drive 528 to rotate right-angle gear drive 528 in a direction that is indicated by rotational vector 522. An upward movement of mounting enclosure 122, for example, may cause piston 530 to extend. In response, right-angle gear drive 528 may rotate clockwise to cause piston 520 to extend. However, the movement of piston 520 is resisted by the damper force exerted by the associated MR fluid surrounding piston 520 as discussed above. As such, an upward movement of mounting enclosure 122 is resisted by MR piston 520 through rotational actuation of right-angle gear drive 528.

A downward movement of mounting enclosure 122, on the other hand, may cause piston 530 to retract. In response, right-angle gear drive 528 may rotate counter clockwise to cause piston 520 to retract. However, the movement of piston 520 is resisted by the damper force exerted by the associated MR fluid surrounding piston 520 as discussed above. As such, a downward movement of mounting enclosure 122 is resisted by MR piston 520 through rotational actuation of right-angle gear drive 528.

As discussed above in relation to components 480-490 of FIG. 4A, a variable damper force may either be programmably static, or adaptive, when applied to piston 520 to effectuate "fine tuned" MR suspension control, while minimizing the vertical separation required between mounting enclosure 122 and platform 120 through the utilization of right angle gear drive 528.

Figure 6A:
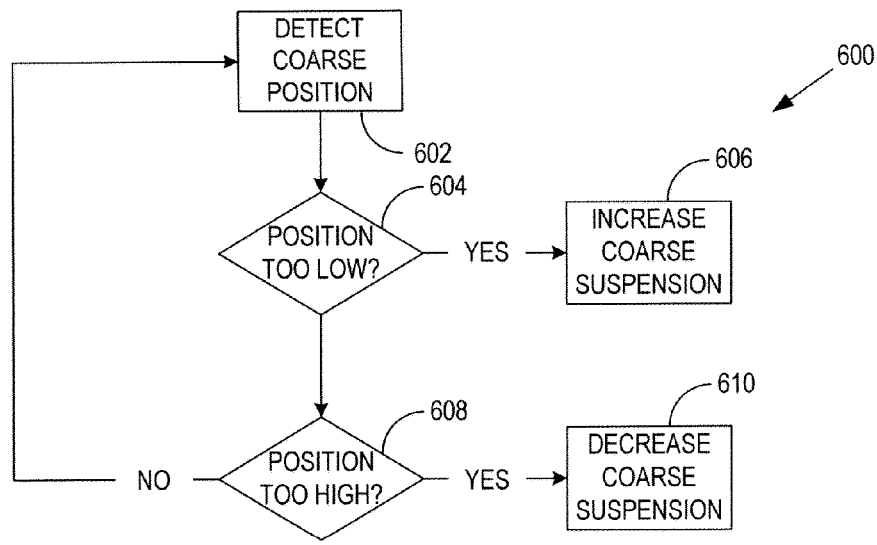
FIG. 6A illustrates an exemplary flow diagram of a method of providing coarse suspension control.

Turning to FIG. 6A, a method of coarse suspension control is exemplified via flow diagram 600 and is described in relation to FIGS. 4A, 4B, and 5. In step 602, a position of mounting enclosure 122 is detected via magnetic sensors 430,432 and 466,468 during, for example, a wake-up mode as discussed above. Since the weight distribution along a longitudinal axis depicted by directional vector 442 may be non-uniform, sensors 430,432 detect vertical movement along a vertical axis depicted by directional vector 440 and sensors 466,468 independently measure vertical movement along a vertical axis depicted by directional vector 470.

Should mounting enclosure 122 be deflected below its equilibrium position, as detected in step 604 by either of sensors 430,432 and/or 466,468, then signal 434 and/or signal 474 is dispatched to compressors 436 and/or 472 to counteract the downward displacement. In particular, compressors 436 and/or 472 inject air into pneumatic support components 302 and/or 304 in response to signals 434 and/or 474 to increase the magnitude of coarse suspension provided to mounting enclosure 122 as in step 606.

Should mounting enclosure 122 be deflected above its equilibrium position on the other hand, as detected in step 608 by either of sensors 430,432 and/or 466,468, then signal 434 and/or signal 474 is dispatched to compressors 436 and/or 472 to counteract the upward displacement. In particular, release valves within compressors 436 and/or 472 cause air to be released from pneumatic support components 302 and/or 304 in response to signals 434 and/or 474 to decrease the magnitude of coarse suspension provided to mounting enclosure 122 as in step 610.

Figure 6B:
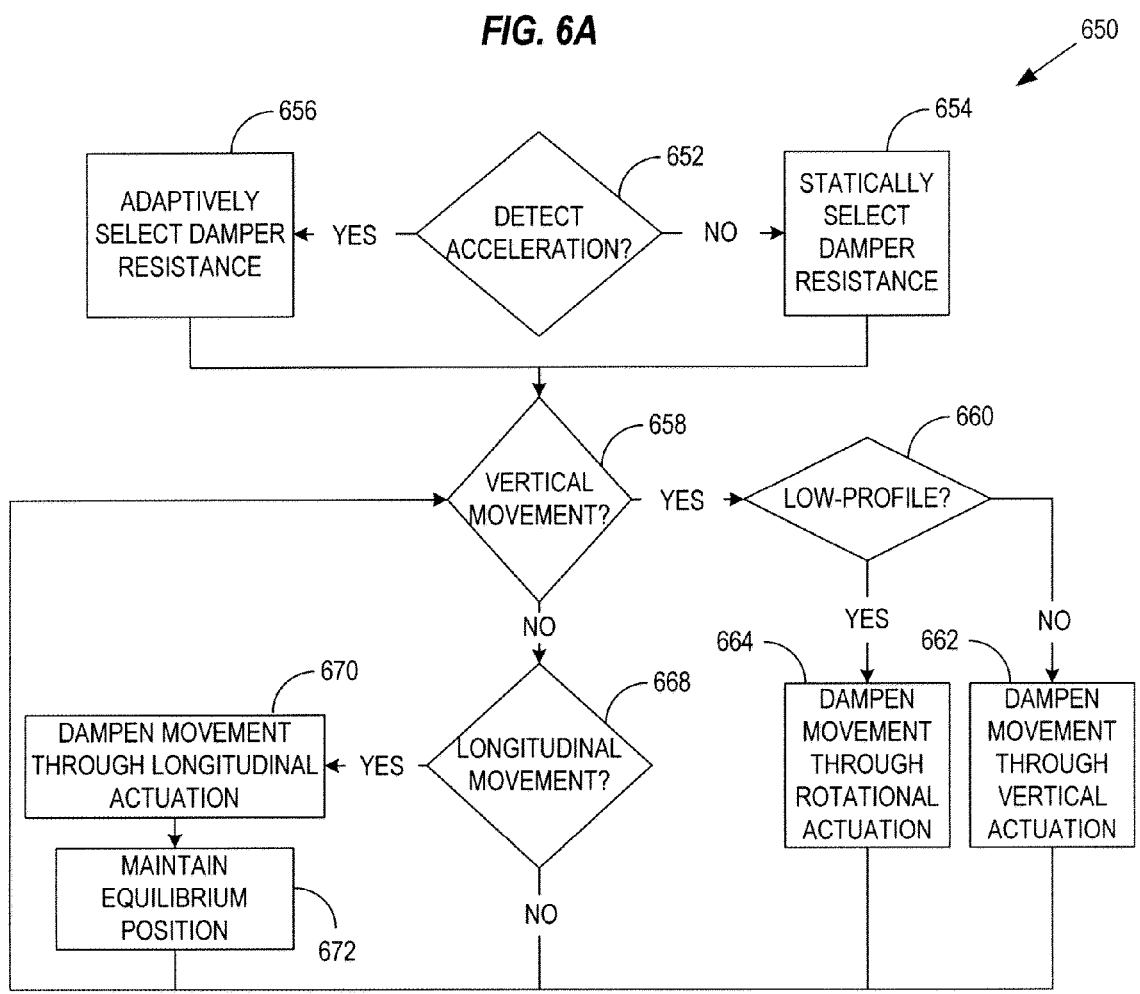
FIG. 6B illustrates an exemplary flow diagram of a method of providing fine suspension control.

Turning to FIG. 6B, a method of fine suspension control is exemplified via flow diagram 650 and is described in relation to FIGS. 4A, 4B, and 5. In step 652, detection of acceleration forces is either activated or deactivated. If activated, then accelerometers 486, 426, and 462 are selected in step 656 to provide adaptive control signals to PWMs 490, 422, and 458, respectively, to indicate the magnitude and direction of acceleration forces measured for appropriate selection of damper resistance. If deactivated, on the other hand, then acceleration forces are not detected and potentiometers 488, 424, and 460 are selected in step 654 to provide programmably static control signals for static selection of damper resistance.

In addition, a weight measurement is taken, whereby weight information received by control blocks 401,409 from sensors 428,464, signal LOAD, or from some other weight sensing device, may be used to program the nominal damper resistance. In particular, performance of the fine suspension devices of supports 204, 206, and 492 may be optimized by selecting a nominal damper resistance that is proportional to the weight of mounting enclosure 122 in either of the dynamic or static control modes.

If vertical movement is detected in step 658, then either a low-profile, or a normal profile, mode of vertical suspension is provided. If vertical suspension is provided as exemplified in FIG. 4A, then kinetic energy is dampened through substantially vertical actuation of MR piston 484 as in step 662. The amount of damper resistance applied to piston 484 being determined in either of steps 654 or 656 as discussed above.

If, on the other hand, vertical suspension is provided as exemplified in FIG. 5, then kinetic energy is dampened through rotational actuation of MR piston 520 to implement a low-profile mode of vertical suspension. In particular, the range of stroke of piston 520 actuates right-angle gear drive 528 to rotate right-angle gear drive 528 in a direction that is indicated by rotational vector 522. An upward movement of mounting enclosure 122, for example, may cause piston 530 to extend. In response, right-angle gear drive 528 may rotate clockwise to cause piston 520 to extend. However, the movement of piston 520 is resisted by the damper force exerted by the associated MR fluid surrounding piston 520 as discussed above. As such, an upward movement of mounting enclosure 122 is resisted by MR piston 520 through rotational actuation of right-angle gear drive 528.

A downward movement of mounting enclosure 122, on the other hand, may cause piston 530 to retract. In response, right-angle gear drive 528 may rotate counter-clockwise to cause piston 520 to retract. However, the movement of piston 520 is resisted by the damper force exerted by the associated MR fluid surrounding piston 520 as discussed above. As such, a downward movement of mounting enclosure 122 is resisted by MR piston 520 through rotational actuation of right-angle gear drive 528. The amount of damper resistance applied to piston 520 being determined in either of steps 654 or 656 as discussed above.

Kinetic energy, as determined in step 668, may also be dampened along a longitudinal axis as depicted by directional vector 442. In particular, both sides of mounting enclosure 122 are "soft" mounted to structural enclosure 202 through MR supports 204 and 206. Damper resistance of MR supports 204 and 206 may be adaptively, or statically, programmed as discussed above. In operation, MR supports 204 and 206 substantially absorb kinetic energy in step 670 that is applied to mounting enclosure 122 along a longitudinal direction as depicted by directional vector 442. In step 672, pneumatic springs, as discussed above in relation to FIG. 4B, operate to maintain mounting enclosure 122 within an equilibrium position with respect to structural enclosure 202 along longitudinal axis 442.

As discussed above, mobile or non-mobile electronic equipment enclosures may not require a multi-axis suspension system at all. Rather, such electronic equipment enclosures may be intended for use in areas that are not subject to movement. Alternatively, such electronic equipment enclosures may be subject to movement that is somewhat benign, which results in minimal kinetic energy transfer to the electronic components contained within the electronic equipment enclosures.

Figure 7:
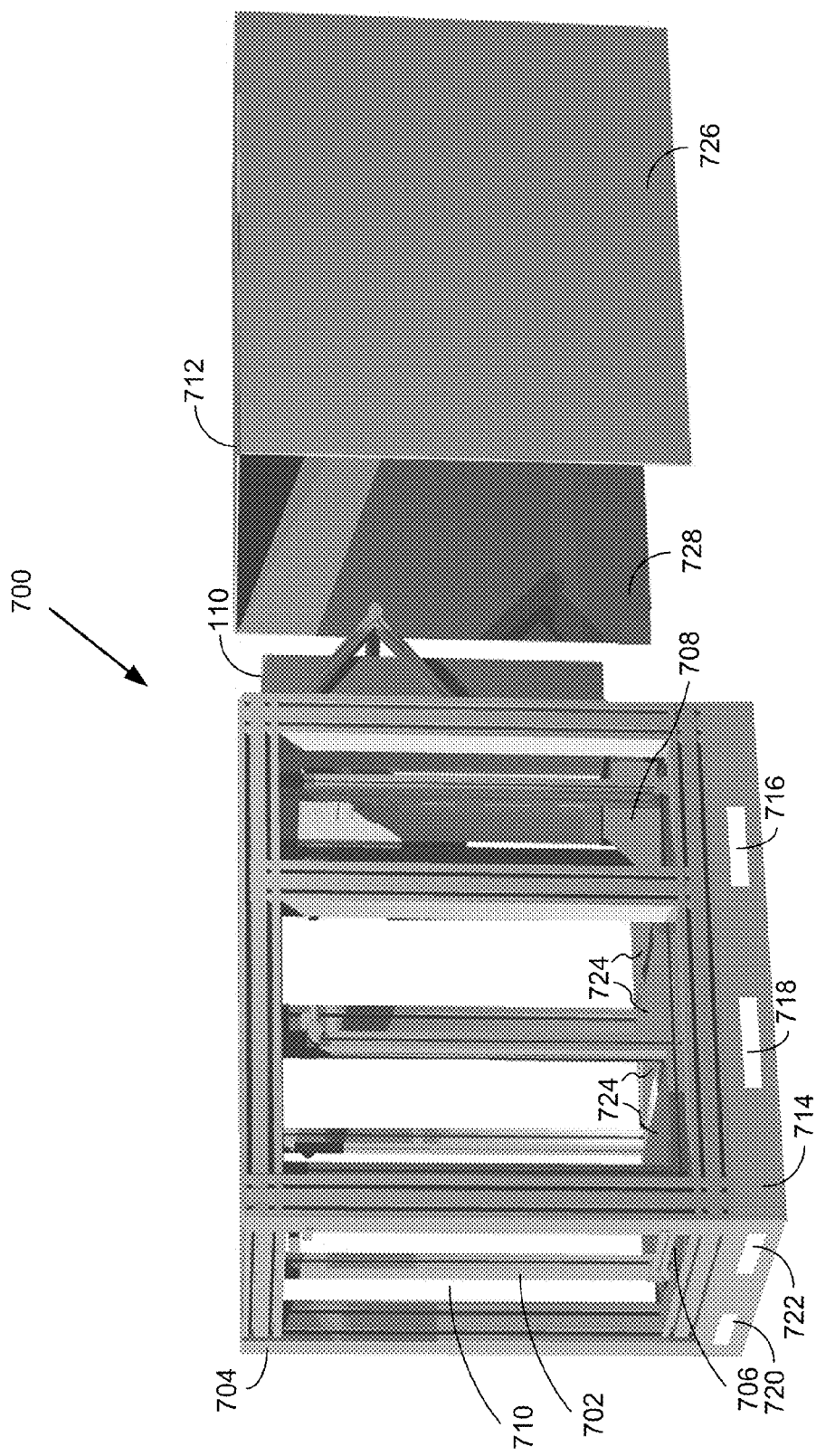
FIG. 7 illustrates an environment-resistant electronic enclosure.

Turning to FIG. 7, environment-resistant electronic enclosure 700 is illustrated, where the first, second, and third modes of suspension as provided herein are optional. The fourth mode of suspension, i.e., elastomeric mounts, may be optional as well and may be utilized as required. It is noted, that if the first, second, and third modes of suspension are omitted, then outer frame 704 may be omitted as well.

In addition, pedestal 714 may be added as an optional component so that environment-resistant electronic enclosure 700 may be moved using a pallet jack, forklift, front loader, or similar jacking device. Openings 716/718 may exist on one or more sides of pedestal 714 and openings 720/722 may exist on one or more ends of pedestal 714, so as to facilitate insertion of the forks of the jacking device.

Pedestal 714 may be made of metal, such as steel or aluminum, and may be permanently mounted to optional outer frame 704 and/or inner frame 702 using, e.g., tig-welding techniques. Conversely, pedestal 714 may be temporarily mounted to optional outer frame 704 and/or inner frame 702 using, e.g., bolting or clamping, techniques.

Enclosure 712 surrounds optional outer frame 704 and/or inner frame 702 to provide environmental protection for the electronic components (not shown) that are mounted within inner frame 702. In one embodiment, enclosure 712 is designed to NEMA 4 specifications, so that enclosure 712 protects the electronic components from contaminants, such as falling dirt, rain, sleet, snow, windblown dust, splashing water, and hose-directed water. Furthermore, the electronic components are protected from the formation of ice on the external portions of enclosure 712.

As can be seen, therefore, environment-resistant electronic enclosure 700 is adapted for outdoor applications, where the need to use separate buildings, or other protective structures, is obviated. As a result, a plurality of environment-resistant electronic enclosures 700 may be implemented outdoors and interconnected as required to produce a complete data center, or other electronic application, without the need to further enclose the network of environment-resistant electronic enclosures for cooling, or any other environmental protection reasons.

As discussed above in relation to FIG. 1, ducted channel 708 is utilized to direct cooled air flow from environment control unit 110 to plenum 706. Ducts 724 form plenum 706 to direct airflow from environment control unit 110 toward the opposite end of environment-resistant electronic equipment rack 700. Other gaps 710 that exist between enclosure 712 and optional outer frame 704 and/or inner frame 702 may be similarly ducted, so as to create zero-bypass flow control of air movement within environment-resistant electronic equipment enclosure 700.

Figure 8:
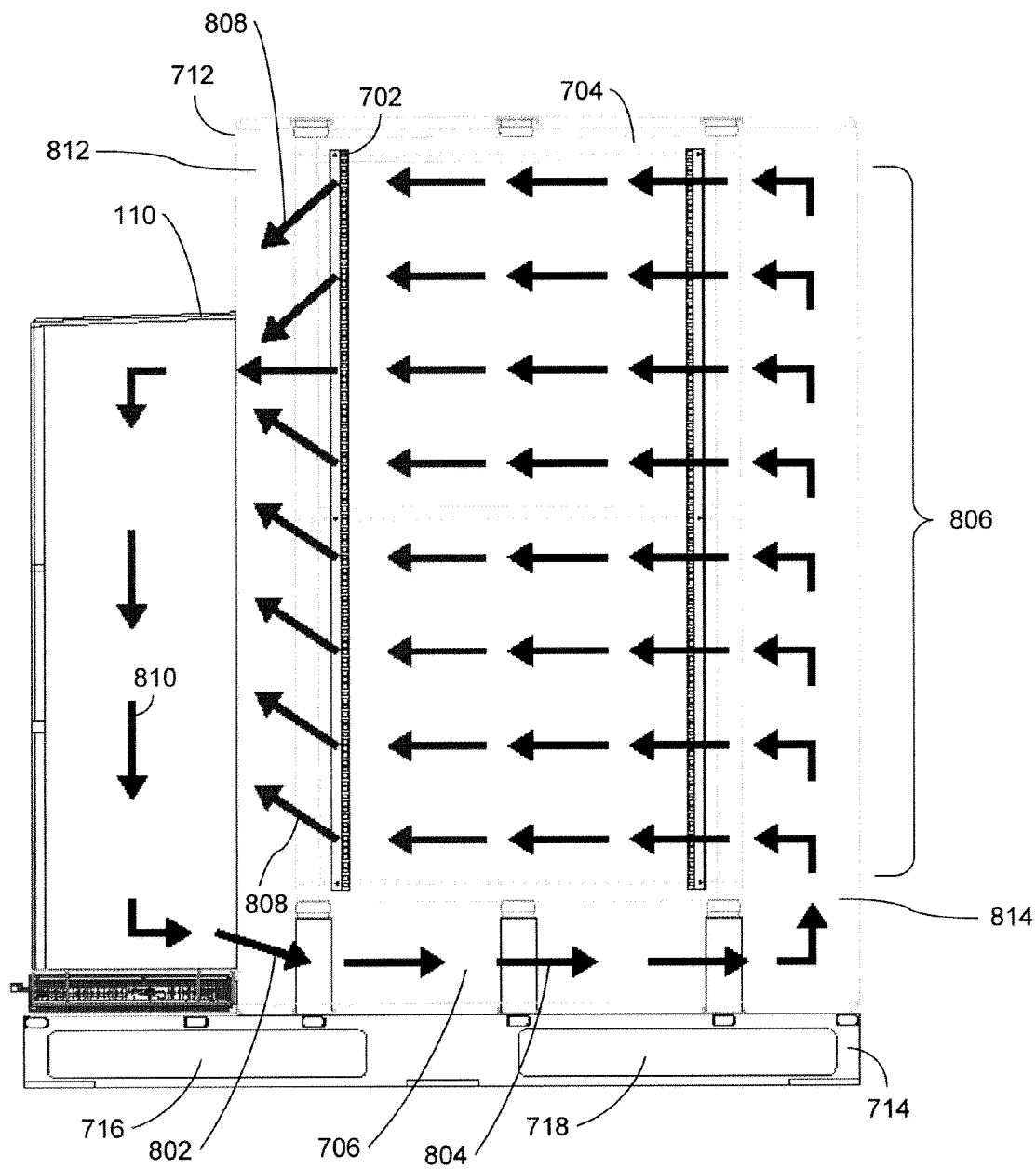
FIG. 8 illustrates airflow control within the environment-resistant electronic enclosure of FIG. 7.

Turning to FIG. 8, zero-bypass airflow control within environment-resistant electronic equipment enclosure 700 is illustrated, whereby airflow from environment control unit 110 is directed to only those volumes within environment-resistant electronic equipment rack 700 that require airflow. In one embodiment, environment control unit 110 is implemented as an HVAC unit that may be mounted on the back side of environment proof enclosure 700 as illustrated.

Ducted channel 708, as illustrated in FIG. 7, is utilized to direct heat exchanged, i.e., cooled, airflow 802 from HVAC unit 110 toward the opposite end of environment-resistant electronic equipment enclosure 700 via plenum 706 that is formed by ducts 724 as illustrated in FIG. 7. It is understood that ducted channel 708 and ducts 724 may be implemented using, e.g., aluminum or rubber, or other materials that facilitate the formation of airflow ducting. Other flexible containment seals, such as brushes, may also be utilized, especially to prevent airflow within gaps 710 that exist between enclosure 712 and optional outer frame 704 and/or inner frame 702 as illustrated in FIG. 7.

Cooled airflow 804 is then allowed to flow upward from plenum 706, so that the electronic components (not shown) operating within environment-resistant electronic equipment enclosure 700 may draw cooled air from high-pressure region 814 into their respective interiors for cooling. It should be noted that high-pressure region 814 exists within environment-resistant electronic equipment enclosure 700 because the volume of air available within region 814 continues to be replenished at a rate greater than the rate of airflow accepted and exhausted by the electronic components. Accordingly, airflow directed into the respective interiors of the electronic components is enhanced by the high-to-low pressure differential that is created between high-pressure region 814 and low-pressure region 812.

Once the air conditioned air is drawn into the individual electronic component interiors, heat is exchanged from the individual electronic components to the cooled airflow to effectively maintain the electronic components operational within their respective temperature limits. Heated airflow 808 may then be vented from the individual electronic components and collected by HVAC unit 110 to be cycled into cooled airflow 810.

Figure 9:
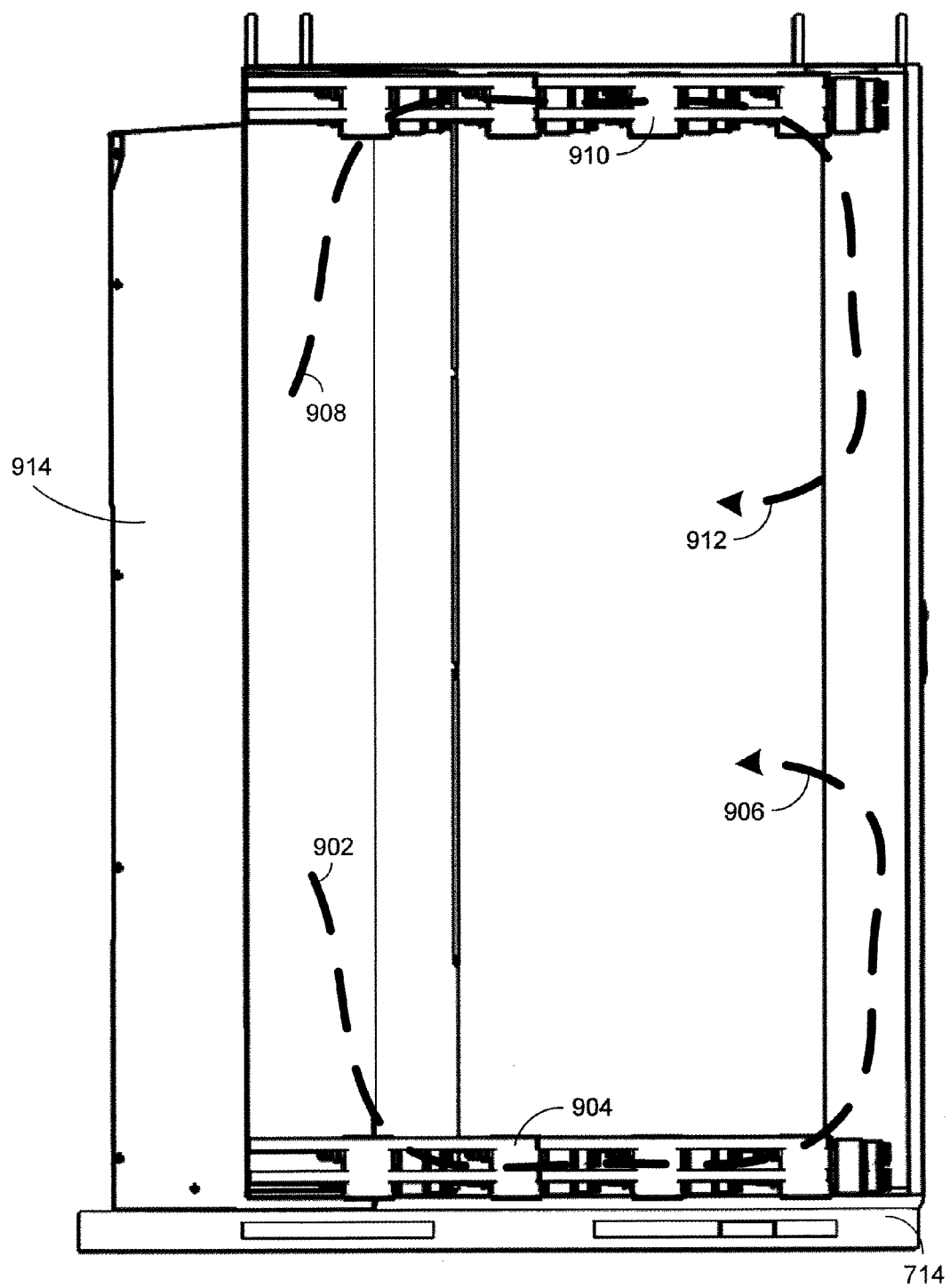
FIG. 9 illustrates an alternate embodiment of the environment-resistant electronic enclosure of FIG. 7.

In an alternate embodiment as shown in FIG. 9, a side-view of environment-resistant electronic equipment enclosure 700 illustrates placement of liquid-based heat exchangers 904 and 910. Liquid-based heat exchangers 904 and 910 may be adapted for use with liquids, such as water and glycol, when liquid-based cooling systems (not shown) are utilized for cooling. Alternately, liquid-based heat exchangers 904 and 910 may instead represent the cooling coils of an HVAC unit, whereby the liquid flowing within liquid-based heat exchangers 904 and 910 is a refrigerant.

Figure 10:
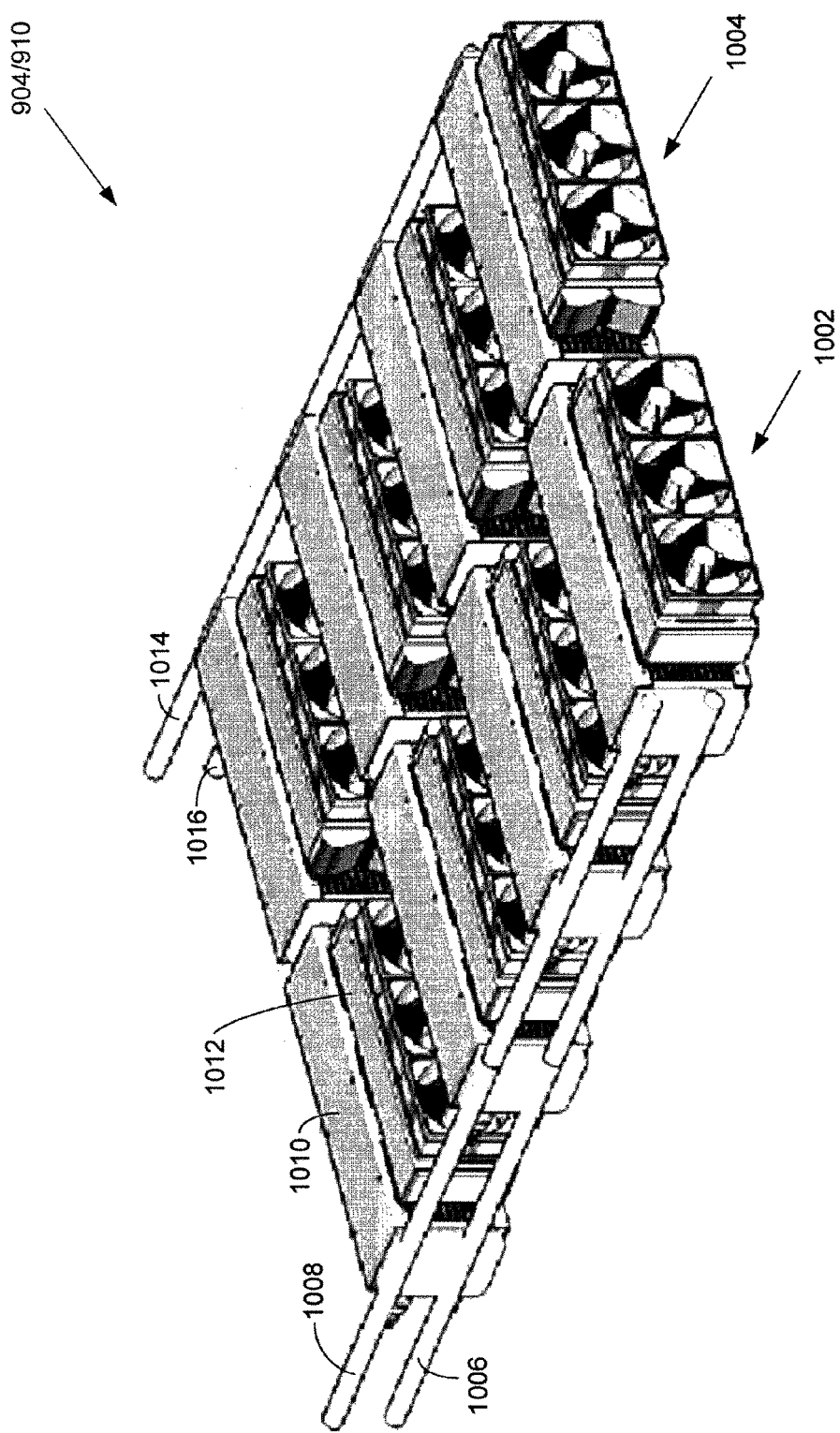
FIG. 10 illustrates a liquid-based heat exchanger adapted for use within the environment-resistant electronic enclosure of FIG. 9.

Turning to FIG. 10, an exemplary embodiment of liquid-based heat exchangers 904 and 910 is illustrated. In operation, heated airflow 902 and 908 is directed over cooling elements 1010 of liquid-based heat exchangers 904 and 910 using fans 1012. It is noted that the surface area of cooling elements 1010 may be increased as required and the number of fans 1012 may be decreased as required. Accordingly, the size, shape, and orientation of cooling elements 1010 and fans 1012 may be altered as required by the particular application.

In addition, a redundant implementation may be utilized, whereby column 1002 of liquid-based heat exchangers and column 1004 of liquid-based heat exchangers represent separate cooling systems within environment-resistant electronic equipment enclosure 700. In such an instance, liquid inlets 1008 and 1014 facilitate ingress of a cooling liquid, while outlets 1006 and 1016 facilitate egress of the cooling liquid.

In operation, cooled liquid enters the respective interiors of cooling elements 1010 via inlets 1008 and 1014 to make contact with the cooling surfaces of cooling elements 1010. Thermodynamic heat exchange causes the heat contained within airflow 902,908 to dissipate into the cooled liquid, thereby causing the temperature of the cooled liquid to increase. The heated liquid is then removed via outlets 1006, 1016 to be recycled back into cooled liquid.

In a first embodiment, heated liquid from a plurality of heat exchangers 904/910 received from a plurality of environment-resistant electronic equipment enclosures 700 may be collected, cooled, and then recirculated by a central cooling facility (not shown) that is located in the vicinity of the plurality of environment-resistant electronic equipment enclosures 700. In alternate embodiments, each environment-resistant electronic equipment enclosure 700 may provide its own cooling facility 914 as illustrated in FIG. 9. In such an instance, cooling facility 914 may represent an HVAC unit, or alternatively may represent an air-cooled or water-cooled water chiller.

Figure 11:
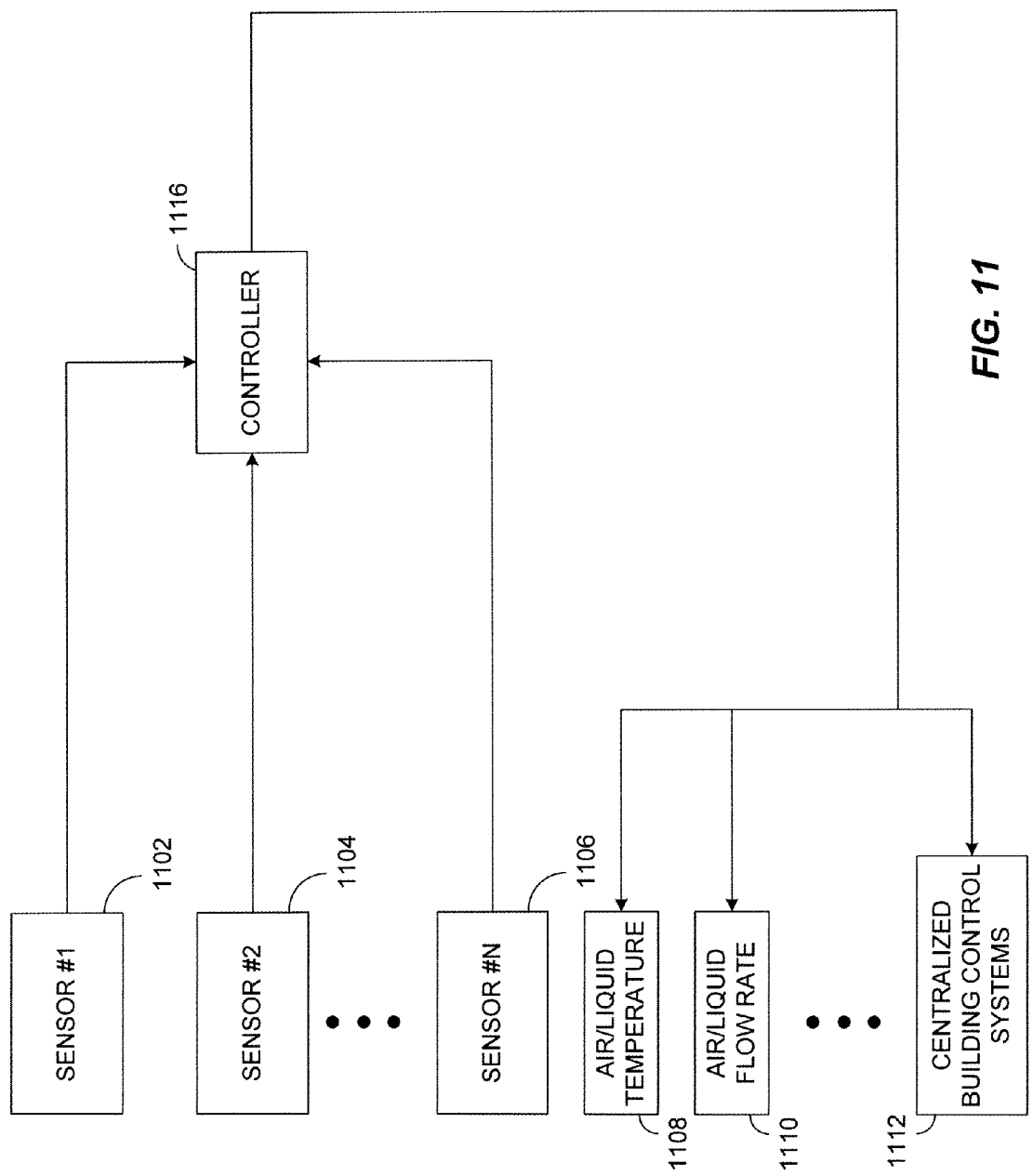
FIG. 11 illustrates an active thermal management system incorporated an environment-resistant electronic enclosure.

In either instance, an active thermal management system, as illustrated in FIG. 11, may be implemented within each environment-resistant electronic equipment enclosure 700. Sensors 1102-1104, for example, may be utilized within regions 812 and 814 to measure the temperature differential between heated airflow 808/902,908 and cooled airflow 806/906,912. Additional sensors 1106 may also be implemented to measure, e.g., the magnitude of power consumed by the electronic equipment contained within the environment-resistant electronic equipment enclosures 700. As a result, metrics that are indicative of the efficiency of the cooling system may be gathered, taking into account such variables as the magnitude of power consumed, the magnitude of heat generated, and the magnitude of heat transfer utilized to cool the electronic equipment to a desired temperature.

In response to the sensor data received, active thermal management controller 1116 may be utilized to adjust air/liquid flow rate 1110 and air/liquid temperature 1108, as generated by, e.g., the HVAC, fan, and/or chiller components provided herein. In addition, other components, such as variable speed fans, digitally controlled compressors, and variable flow rate pumps, may also be controlled as necessary to provide active thermal management via feedback control within each environment-resistant electronic equipment enclosure 700 as illustrated in FIG. 11.

In alternate embodiments, sensor data 1102-1106 may be exported by each individual environment-resistant electronic equipment enclosure 700. In such an instance, each active thermal management controller 1116 within each environment-resistant electronic equipment enclosure 700 may interoperate with centralized building control systems 1112 to adjust liquid/air flow rates and other variables as required, to maintain the temperatures within environment-resistant electronic equipment enclosures 700 to their selected values.

Figure 12:
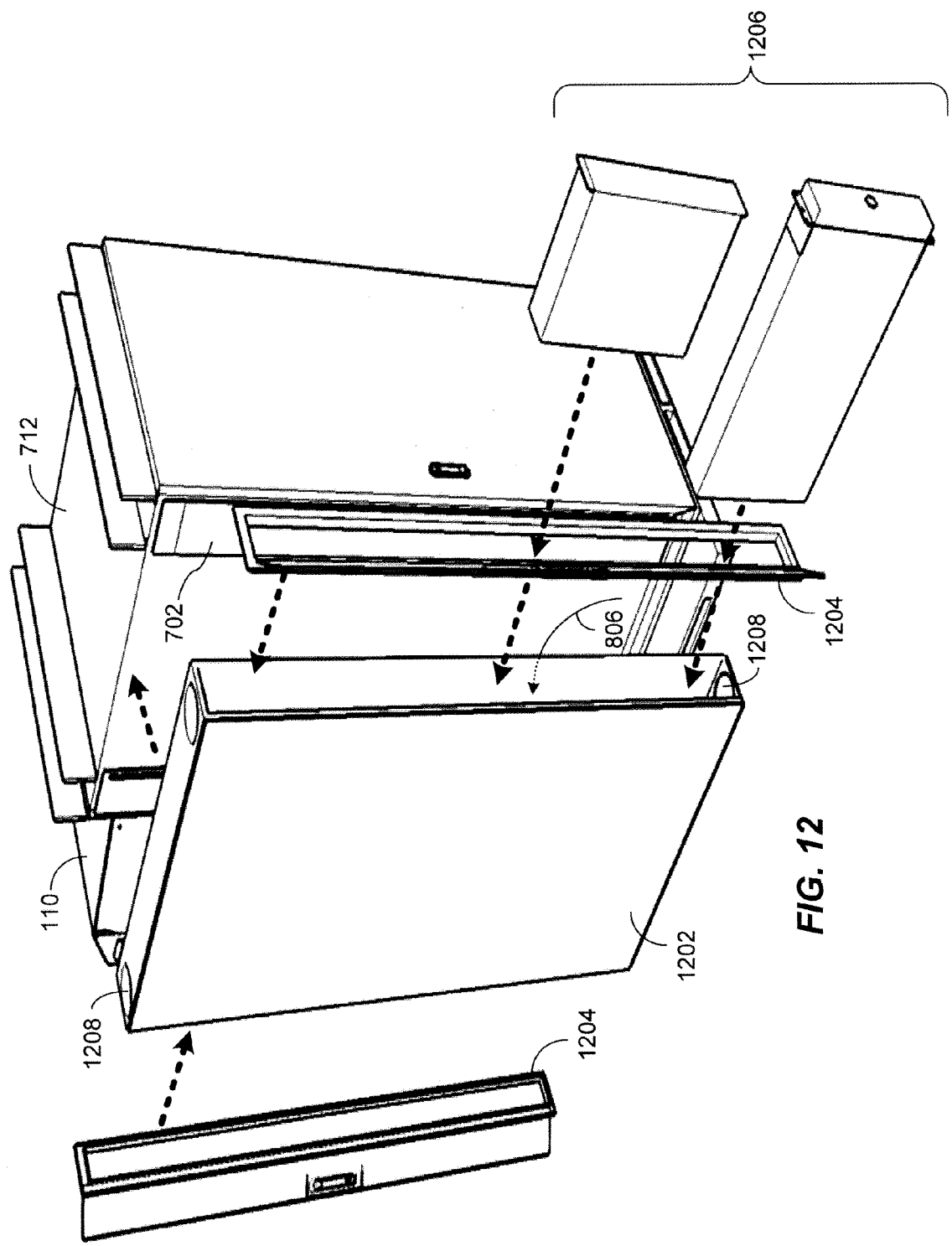
FIG. 12 illustrates an alternate embodiment of the environment-resistant electronic enclosure of FIG. 7.

Turning to FIG. 12, an alternate embodiment is illustrated whereby side(s) 726 and/or 728 of enclosure 712 may be replaced with sidecar 1202, which facilitates the mounting of equipment 1206 within sidecar 1202 along either side of environment-resistant electronic equipment enclosure 700. Access panels 1204 provide access to equipment 1206 once installation into sidecar 1202 is complete. Accordingly, equipment that could otherwise be mounted laterally within inner frame 702 may instead be mounted within sidecar 1202 in a vertical fashion as illustrated.

Sidecar 1202 may be mounted to inner frame 702, whereby cooled air 806, as illustrated in FIG. 8, or cooled air 906,912 as illustrated in FIG. 9, is allowed to flow into sidecar 1202 from within the interior of environment-resistant electronic equipment enclosure 700. Accordingly, the respective interiors of equipment 1206 mounted within sidecar 1202 may receive cooled air 806/906,912. Examples of equipment 1206 that may be mounted within sidecar 1202 include switches, routers, management consoles, etc. Grommets 1208 within sidecar 1202 provide for cabling ingress and egress, not only into/from sidecar 1202, but also into/from the interior of environment-resistant electronic equipment enclosure 700.

Other aspects and embodiments of the present invention will be apparent to those skilled in the art from consideration of the specification and practice of the invention disclosed herein. For example, the non-mobile enclosure of FIGS. 7-9 may instead be mounted directly to a raised-floor platform as may be provided by the particular non-mobile application, such as in an equipment room of a telecommunications facility. In such an instance, cooled air/liquid may not be provided by a self-contained environment control unit, but rather may be provided by a plenum of the equipment room. It is intended, therefore, that the specification and illustrated embodiments be considered as examples only, with a true scope and spirit of the invention being indicated by the following claims.

What is claimed is:

1. An electronic component enclosure, comprising:
   a platform;
   an inner frame coupled to the platform;
   an enclosure surrounding the inner frame;
   a first set of electronic components mounted within the inner frame;
   an environment control unit coupled to the enclosure, the environment control unit generating cooled airflow without introducing external air into the enclosure;
   a plenum formed below the inner frame, the plenum forming a duct to direct the cooled airflow to the first set of electronic components; and
   a ducted channel coupled to the environment control unit and the plenum to direct the cooled airflow from the environment control unit to the plenum.

2. The electronic component enclosure of claim 1, wherein the platform is adapted to accept forks of a jacking device.

3. The electronic component enclosure of claim 2, further comprising a sidecar coupled to the enclosure, the sidecar being adapted to facilitate mounting of a second set of electronic components within an interior of the sidecar and further adapted to provide the airflow from the environment control unit to the second set of electronic components.

4. The electronic component enclosure of claim 1, further comprising flexible containment seals coupled between the inner frame and the enclosure to further direct the airflow from the environment control unit to the first set of electronic components.

5. An electronic component enclosure, comprising:
   a platform;
   an inner frame coupled to the platform;
   a first set of electronic components mounted within the inner frame;
   a water-resistant enclosure surrounding the inner frame, wherein the water-resistant enclosure shields the first set of electronic components from contaminants; and
   an environment control unit coupled to the water-resistant enclosure, the environment control unit generating cooled airflow without introducing external air into the water-resistant enclosure.

6. The electronic component enclosure of claim 5, further comprising a plenum formed below the inner frame, the plenum forming a duct to direct the cooled airflow to the first set of electronic components.

7. The electronic component enclosure of claim 6, further comprising a ducted channel coupled to the environment control unit and the plenum to direct the cooled airflow from the environment control unit to the plenum.

8. The electronic component enclosure of claim 7, further comprising flexible containment seals coupled between the inner frame and the water-resistant enclosure to further direct the cooled airflow from the environment control unit to the first set of electronic components.

9. The electronic component enclosure of claim 5, further comprising a sidecar coupled to the water-resistant enclosure, the sidecar being adapted to facilitate mounting of a second set of electronic components within an interior of the sidecar.

10. The electronic component enclosure of claim 5, wherein the platform is adapted to accept forks of a jacking device.

11. The electronic component enclosure of claim 10, wherein the jacking device includes one of a pallet jack, a forklift, and a front loader.

* * * * *